United States Patent

Odlen et al.

[11] 4,292,467
[45] Sep. 29, 1981

[54] CONTROL FOR AUDIO RECEIVER

[75] Inventors: Lars Odlen, Lund; Anders Hansson, Trelleborg, both of Sweden

[73] Assignee: Transcale A.B., Vesteras, Sweden

[21] Appl. No.: 948,422

[22] Filed: Oct. 4, 1978

[30] Foreign Application Priority Data

Oct. 7, 1977 [SE] Sweden .............................. 7711298

[51] Int. Cl.³ .............................................. H03G 5/02
[52] U.S. Cl. ............................. 179/1 D; 179/1 VL;
333/28 T; 455/233
[58] Field of Search ................ 179/1 D, 1 VL, 1 SW;
325/455, 457, 464; 333/28 T, 132; 455/177,
200, 233; 364/706, 709

[56] References Cited

U.S. PATENT DOCUMENTS

| 2,760,011 | 8/1956 | Berry | 333/18 |
|---|---|---|---|
| 3,177,432 | 4/1965 | Kelln | 325/457 |
| 3,732,373 | 5/1973 | Boyden | 179/1 D |
| 3,842,205 | 10/1974 | Okamoto | 179/1 D |
| 3,949,325 | 4/1976 | Berkovitz | 179/1 D |
| 3,979,057 | 9/1976 | Katz et al. | 364/706 |
| 4,009,379 | 2/1977 | Musch | 364/706 |
| 4,035,627 | 7/1977 | Dickinson et al. | 364/709 |
| 4,092,594 | 5/1978 | Baker | 325/455 |
| 4,093,922 | 6/1978 | Buss | 325/464 |
| 4,122,395 | 10/1978 | Schotz et al. | 325/464 |
| 4,135,158 | 1/1979 | Parmet | 325/455 |

Primary Examiner—Bernard Konick
Assistant Examiner—Randall P. Myers
Attorney, Agent, or Firm—Yount & Tarolli

[57] ABSTRACT

An audio receiver or other electronic device having a number of controllable functions is provided with control apparatus in which mechanical parts have been substantially eliminated. An electrically controllable device is provided to control each function. Memory registers provide inputs to the electrically controllable devices. The controllable functions may be on-off, as for a particular signal source, or may be variable, as for volume, tuning and tone in a receiver. Input controls include a single level control for adjusting the levels of all of the variable functions, and switches to select the function to be adjusted. Control means such as a microprocessor scans the switches and level control for changes in level and/or functions selected and updates the memory registers accordingly. A display is provided of selected functions and level.

19 Claims, 21 Drawing Figures

FIG. 2

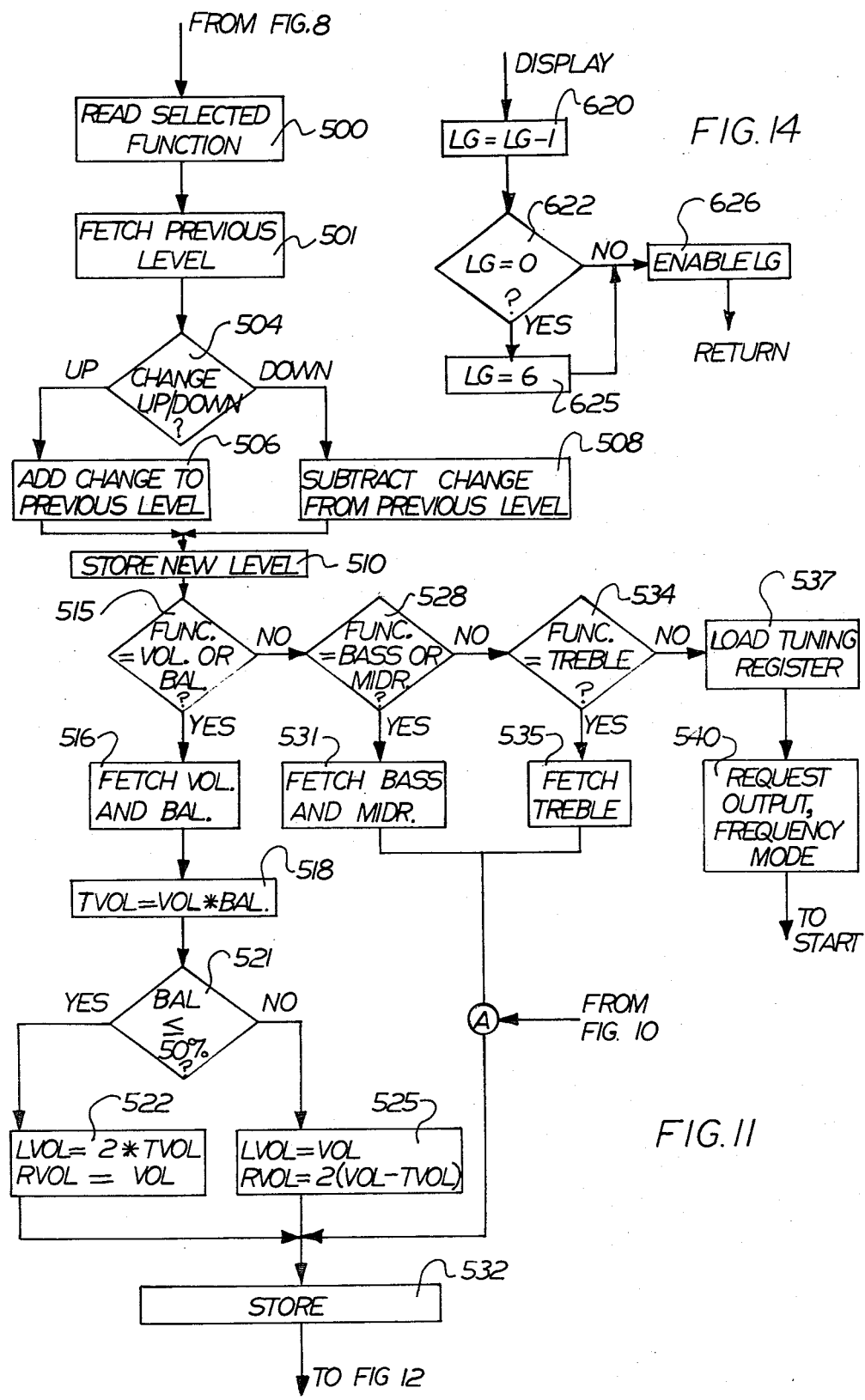

CONTROL FOR AUDIO RECEIVER

TECHNICAL FIELD AND BACKGROUND OF THE INVENTION

The present invention relates to electronic devices, particularly audio and visual devices such as radio and television receivers, tape recorders, audio amplifiers, and the like which require adjustment of a number of variable functions in order use them fully. Such functions for an audio device include for example, tuning frequency, volume, stereo balance and tone correction.

Known devices of the type described normally are provided with separate adjusting means for each of the variable functions. Typically, such adjusting means consist of knobs or levers which control potentiometers, variable capacitors or stepping switches. The position of the knob or lever indicates the level of the adjusted function. To indicate a frequency setting, it is common to use a lineal scale with a pointer which is mechanically coupled to an adjusting knob.

Electronic devices of the kind described above accordingly contain a number of more less complicated mechanical adjusting means, despite the fact that the main function of the device is entirely electronic. The mechanical parts contribute to high manufacture and assembly costs, and make the devices difficult to service. A high percentage of the problems arising in modern devices of the type described are mechanical in origin, and this is a very undesirable and costly consequence of the designs presently in use.

BRIEF SUMMARY OF INVENTION

A general object of the present invention is to provide improved control apparatus for electronic devices having one or more functions of variable level wherein mechanical components have been substantially eliminated, whereby the disadvantages in the known control apparatus are avoided.

According to the present invention, there is provided control apparatus for an electronic device having a plurality of variable functions, for example, volume and tone in an audio device. Electrically controllable means such as switches are provided for setting the levels of the functions and a memory stores an electronic signal for controlling the controllable means. A single level adjusting means is provided for the plurality of functions and means are provided for selecting a function for adjustment. The level adjusting means, when operated, produces signals representing a desired level change in the selected function. A control means reads the level change signals, determines an adjusted level signal and provides it to the memory.

In a particular examples for volume and tone controls in an audio receiver, solid state switches are employed to control the gain in the common signal path for volume control and in bass, treble and midrange signal paths for tone control. The states of the switches are determined by the contents of digital memory registers. One of a pair of level change flip-flops is loaded by pulses from a pulse generating means which is manipulated to provide pulses representing a desired level change. A function can be selected for level display and adjustment by means of selector switches. A memory in the control means stores addresses for the registers that contain the function levels and also stores the function levels. In response to selection of a function, the control means obtains the function level and register address from memory and causes the level to be displayed. The level is adjusted continually according to the content of the level adjusting flip-flop and the new levels are continually displayed and provided to the function register. The change in level can then be observed visually and audibly as it is effected. Preferably, the control means includes a programmed microprocessor.

According to another aspect of the invention, a stereophonic receiver embodying the invention includes electrically controllable means for setting the volume in each channel. Stereo balance is then implemented by controlling the volume in one channel with respect to the other with no need for a separate electrically controllable means for setting balance.

A correction for loudness may also be implemented without the need for an electrically controllable means for setting loudness.

Another aspect of the invention involves the arrangement of the tone control circuits for obtaining the bass, treble and midrange frequencies from the audio signal.

The control apparatus according to this invention thus eliminates substantially all mechanical parts along with the disadvantages of their ureliability and cost.

BRIEF DESCRIPTION OF THE DRAWINGS

FIGS. 8 to 14 are flow diagrams illustrating the operation of the microprocessor system of FIG. 5.

DETAILED DESCRIPTION OF INVENTION

Figure 1:
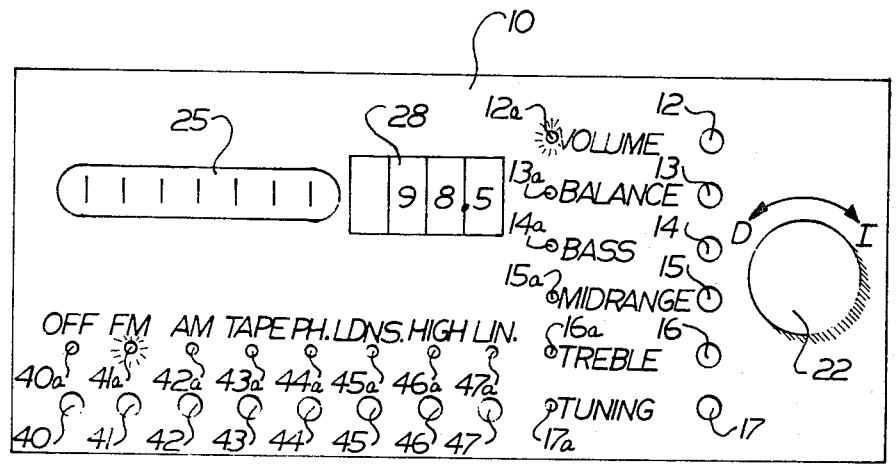
FIG. 1 is a view of a control panel for an audio receiver embodying the present invention.

Referring initially to FIG. 1, the control panel 10 of an audio receiver embodying the present invention includes a number of function selector switches identified by the numerals 12 through 17 for the functions indicated such as volume, balance, etc. A series of indicator lamps 12a to 17a indicate the variable function selected by the corresponding selector switch 12–17. The level of each of these functions must be variable during the operation of the receiver in order to fully enjoy it. A single level adjusting knob 22 is provided as the input device for adjusting the levels of the functions. A level display 25 is provided in the form of a thermometer-type scale for indicating the level of a selected variable function.

A series of selector switches 42–47 and corresponding indicator lamps 42a to 47a are provided for selecting and indicating the selection of two-valued or "on-off" functions. The on-off functions include the source of the audio signal, whether FM, AM, tape or phonograph, the selection of a high pass filter in the audio signal path, linear rather than tone controlled signal and a loudness correction. A four digit display 28 indicates the frequency of an AM or FM tuner when that signal source is selected. When a tuner is not the audio signal source the display 28 indicates the time of day.

The functions illustrated and selectable on control panel 10, whether variable or "on-off", are merely examples and other functions may be provided.

The selector switches 12 to 17 and 42 to 47 are preferably mechanical pushbutton switches. Although mechanical, these switches along with "mechanical" level adjusting knob 22 were deliberately chosen as operator input devices to provide better "feel" for the operator. As will become apparent below the functions performed by these mechanical elements are quite limited and no reduction in reliablity is encountered because of their use.

When the device is first activated by, for example, selecting the FM tuner as the signal source, the other functions and levels which are activated and displayed are those which were last selected. For example, control panel 10 indicates that the FM tuner is the signal source selected since indicator lamp 41a is on. Frequency display 28 indicates that the station last selected and now playing has a broadcast frequency of 98.5 MHz. Indicator lamp 12a indicates that volume level, as previously set, is displayed on scale 25 and is selected for adjustment by means of knob 22.

If the operator wishes to switch to the phonograph input, switch 44 is operated. Indicator lamp 44a is turned on while FM lamp 41a and frequency display 28 are turned off. If the operator then desires to change the volume setting he need only turn level selector knob 22 in the increase or decrease direction and the indicator scale 25 will immediately display the adjusted volume level.

If the operator instead desires to change the treble setting, he operates treble switch 16 and indicator scale 25 will immediately display the existing treble setting. By then turning level selector knob 22 in the appropriate direction the treble setting will be changed and indicator scale 25 will display the adjusted treble setting. The remaining functions may be adjusted in the same way.

If the function selector switches and the level selecting knob 22 are left untouched for five seconds, the variable function selected and displayed automatically becomes volume. With this feature the operator can usually adjust the volume level without having to select this function, which is convenient since it is probably the most frequently adjusted level.

Figure 2:
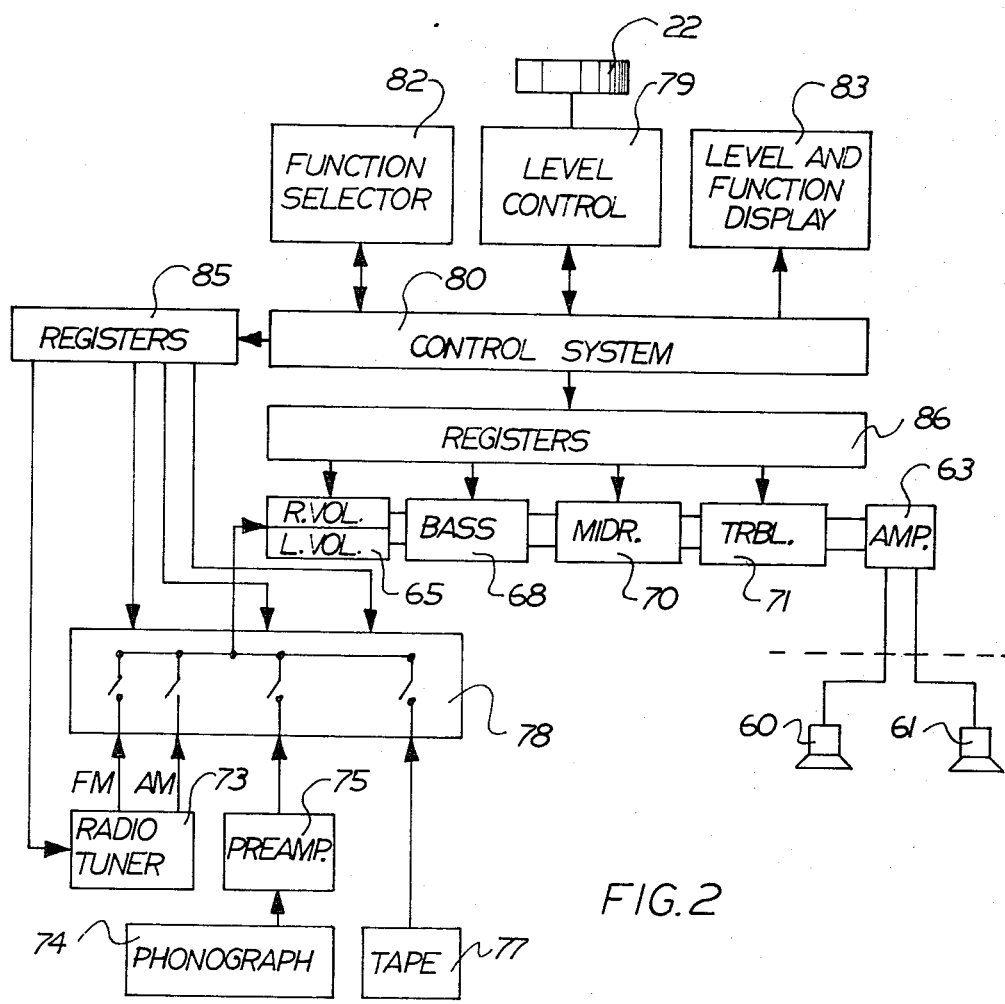
FIG. 2 is a block diagram of an audio receiver embodying the present invention.

As shown diagramatically in FIG. 2, an audio receiver embodying this invention may be connected to speakers 60, 61 which are driven by a power amplifier 63. Amplifier 63 is supplied with audio signals through a volume control circuit 65 including left and right channel controls, and bass, midrange and treble control circuits 68, 70 and 71, respectively. Stereo balance adjustment is also provided by relative adjustment of left and right channel volume controls in a manner described below.

The audio signal source may be an AM/FM tuner 73, a phonograph 74 and preamp 75 or a tape recorder 77. The desired input signal is connected through solid state signal selector switches 78. Each control circuit 65, 68, 70 and 71 and tuner 73 is controllable electrically to adjust the level of the function. Adjustments may be made by the operator from knob 22. In some cases, this will cause adjustments to be made automatically in functions other than the one adjusted by the operator as will become clear below.

A control system 80 communicates with digital memory registers indicated as 85 and 86 which store selection and level commands and provide them to the electrically controllable circuits such as volume control circuit 65. Control system 80 receives commands from function selector 82 (representing switches 12–17, 40–47) and level control 79 as to function and level changes and updates the registers 85 and 86 to effect changes in level land/or functions selected.

More particularly, the registers 85 and 86 store commands as to whether or not a particular function is selected and the levels of the variable functions. The control system 80 instructs the function and level display 83 to indicate the functions selected and the level of the variable function selected and interrogates function selector 82 and level control 79 to detect changes in function and/or level. The registers 85 and 86 are then updated by the control system with the most recently selected functions and levels. The updated contents of the registers act on the control circuit for volume and the like to set the new levels and functions. A manner in which this may be accomplished is described below.

Figure 3:
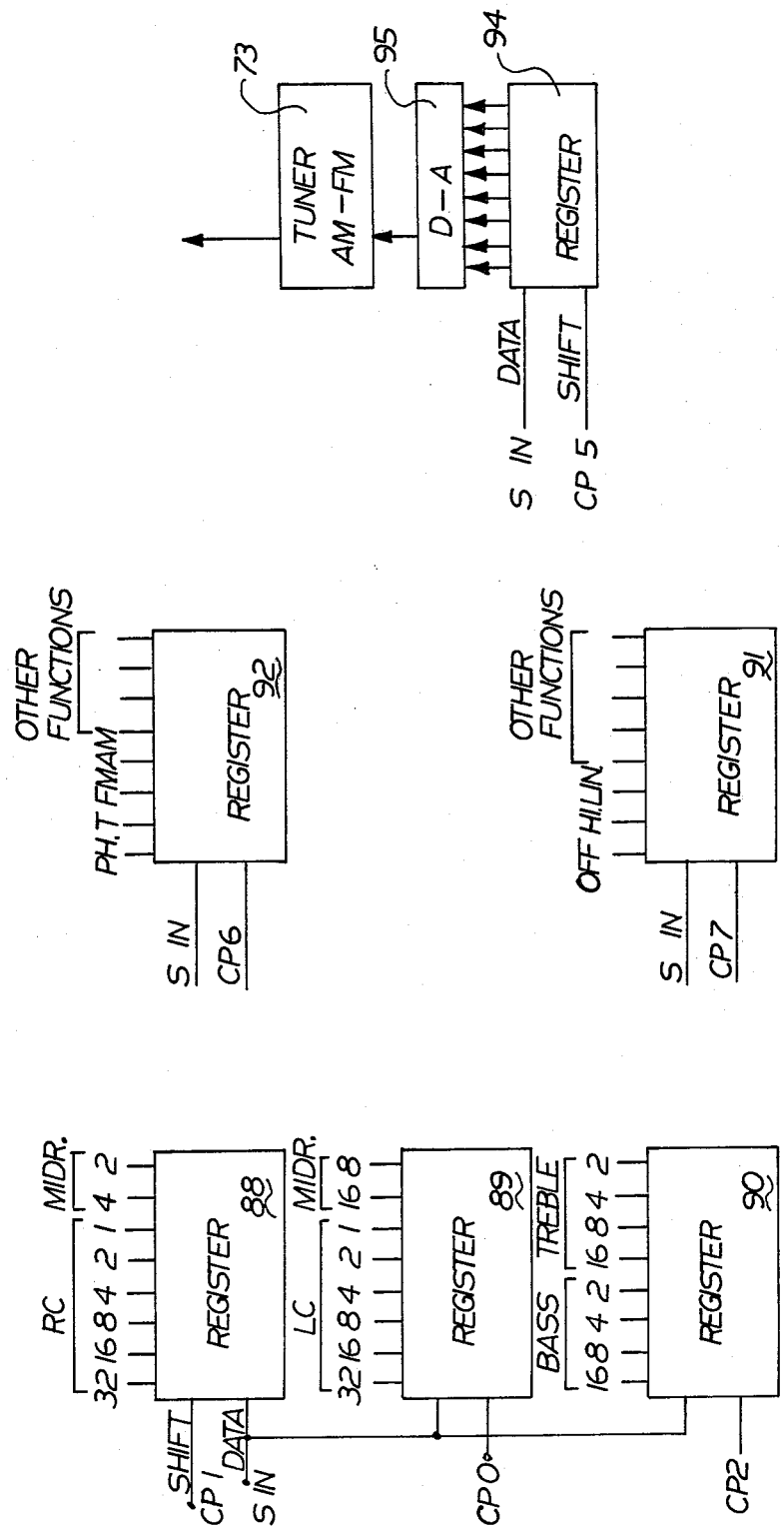
FIGS. 3a to 3c are block diagrams of memory registers which store settings that control the various functions.

As shown in FIGS. 3a to 3c, the registers 85 and 86 of FIG. 2 comprise a number of serial input-parallel output shift registers. Registers 88, 89 and 90 of FIG. 3a store level commands for volume and for bass, midrange and treble tone controls. Volume in the left and right stereo channels is controlled by registers 89 and 88, respectively. Bass and treble gain is controlled from register 90 and midrange gain from registers 88 and 89. When the loudness function is selected on control panel 10 the bass and midrange gains are adjusted in a manner described below wherever the volume is changed. described below whenever the volume is changed.

Register 91 of FIG. 3b stores commands for a linear rather than tone controlled audio signal, for loudness correction and for a high pass filter in the audio signal path as well as the OFF command. Register 92 stores commands for selection of phonograph, tape and FM or AM as the audio signal source. These commands control solid state switches 78 in FIG. 2.

As shown in FIG. 3c AM/FM frequency selection for tuner 73 is controlled from register 94 through a digital-analog converter 95. Tuner 73 is varactor controlled so that the analog voltage from converter 95 is applied to a varactor diode to determine the frequency to which tuner 73 is tuned. Such varactor controlled tuners are known and are commercially available.

Each register in FIGS. 3a to 3c is loaded serially. The input data is provided in common to the input of all registers from control system 80 but only the appropriate register is provided with shift pulses to enable it to load the data.

Figure 4:
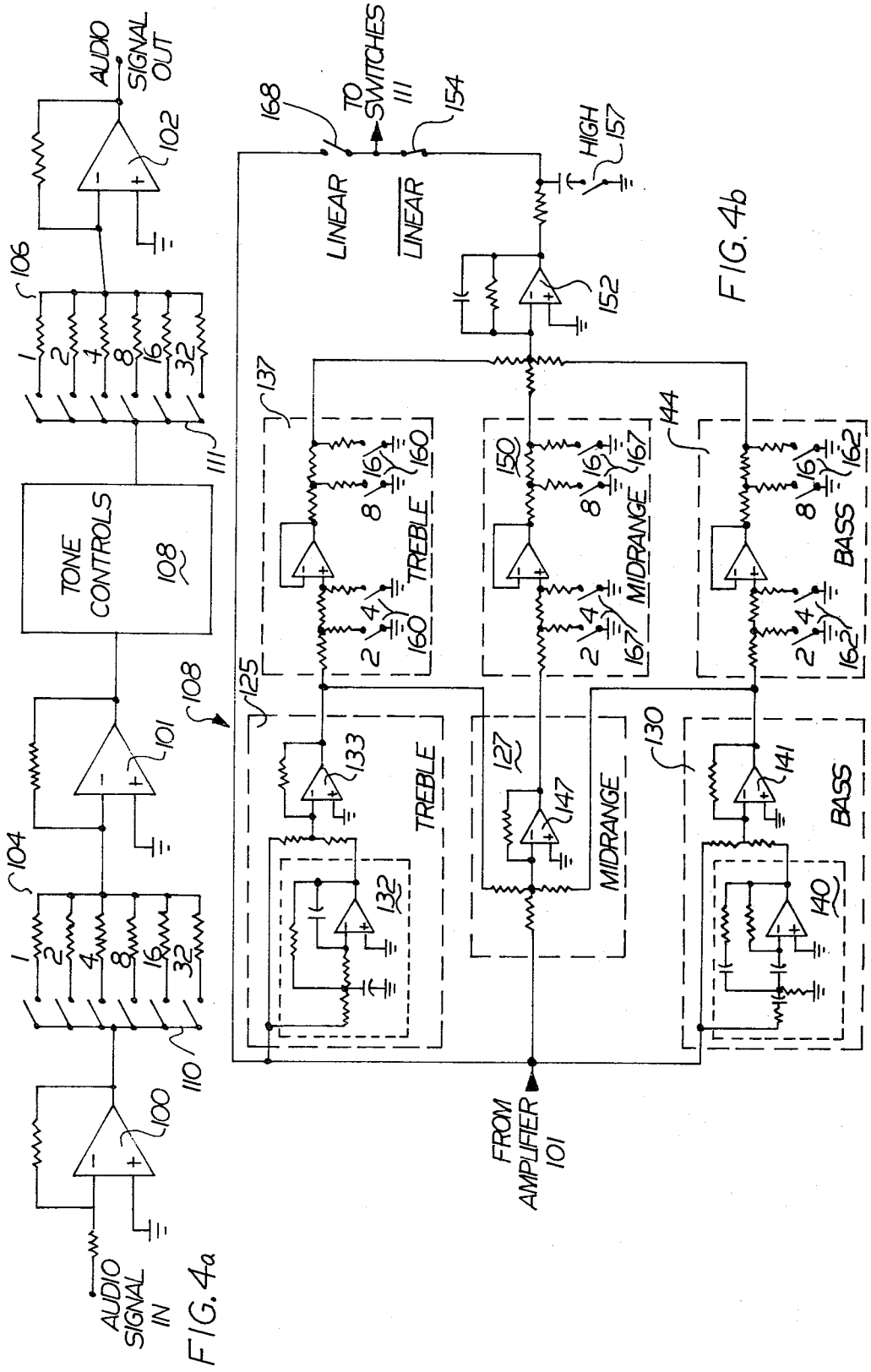
FIGS. 4a and 4b are combined block and schematic diagrams of the volume control circuits and tone control circuits, respectively, in an audio receiver embodying the present invention.

FIGS. 4a and 4b illustrate volume and tone controls, respectively, for an audio receiver emobodying the present invention. As shown in FIG. 4a for one stereo channel, the audio signal is passed through volume controls including amplifiers 100, 101 and 102 with controllable summing networks 104 and 106 and tone controls generally indicated as 108. The volume attenuation provided by networks 104 and 106 is selectable from —0.5b to —72bd in steps which define an inverse quadratic function by operating the appropriate switches 110, 111 which are preferably solid state switches. The state of each switch 110, 111 is controlled by one bit stored in register 88 or 89 of FIG. 3a. The six switches 110 and the six switches 111 for the right stereo channel are controlled from register 88 while the corresponding switches for the left stereo channel are controlled from register 89.

No separate registers are required for the stereo balance function since the volume is controlled individually in the left and right channels. A command change in the stereo balance, therefore, results in increasing or decreasing the attenuation in one channel with respect to the other in a manner described below.

The tone control circuitry is shown in FIG. 4b for one channel, the other channel being identical. The audio signal is divided into treble, midrange and bass signal paths and the signal in each path is selectively attenuated by means of resistors switched in and out in a logarithmic scale.

The arrangement for obtaining the treble, midrange and bass signals possesses a number of advantages over known arrangements. Referring to FIG. 4b, the audio signal is provided in common to a high pass filter 125 to develop the treble signal, to a band pass filter 127 to develop the signal for the midrange frequencies and to a low pass filter 130 to develop the bass signal. The high pass filter 125 in the treble path is formed by subtracting the output of a low pass filter 132 from the audio input signal to obtain the treble frequencies at the output of operational amplifier 133. With this arrangement, the effect of the output from the low pass filter 132 decreases as the frequency on the audio signal at amplifier 133 increases and at very high frequencies the treble signal is essentially the unfiltered audio input signal.

The low pass filter 130 in the bass path is formed in an analogous way by subtracting the output of high pass filter 140 from the audio input signal to obtain the bass frequencies at the output of operational amplifier 141. At very low frequencies, the bass signal from amplifier 141 is essentially the unfiltered audio input signal.

The midrange filter 127 is formed by substracting both the bass and treble signals from the total audio input signal to obtain the midrange frequencies at the output of operational amplifier 147. With this arrangement, when the gain settings in the three paths, treble, midrange and bass, are equal, the frequency response curve of the total combined output signal is substantially flat. This allows the tone controls to be used as a bias setting for the volume controls and the effective range of the tone controls to be substantially doubled.

Further, the fact that the audio input signal is substantially unaffected by any filtering at very low and very high frequencies means that overall stability, slew rate and distortion are unaffected by the tone control settings.

Referring again to FIG. 4b, the treble, bass and midrange signals are provided to respective gain control circuits 137, 144 and 150. The corrected bass, midrange and treble signals from the gain control circuits are summed at operational amplifier 152. The total signal is transmitted to switches 111 in the volume control through a switch 154 which is closed unless the "linear" function is selected. The total signal may be filtered to eliminate "hiss" by selecting the "HIGH" function on control panel 10 to close switch 157.

The treble control circuit 137, midrange control circuit 150, and bass control circuit 144 each include an attenuating ladder in which the degree of attenuation is selectable by switches arranged in a logarithmic scale. The treble control switches 160 and the bass control switches 162 are operated from register 90 (FIG. 3a) and midrange control switches 167 are operated from registers 88 and 89, all in the same manner as described above for the volume control gain switches 110 and 111. The corresponding switches for the two stereo channels are operated as pairs from the same register signal.

The tone controls 108 may be bypassed to provide an uncorrected or linear audio output signal by closing switch 168 and opening switch 154. These switches, along with switch 157 to select the "HIGH" filter, are controlled from register 91 (FIG. 3b). The respective functions are selected on front panel 10 (FIG. 1) by operating the appropriate selector button.

Figure 5:
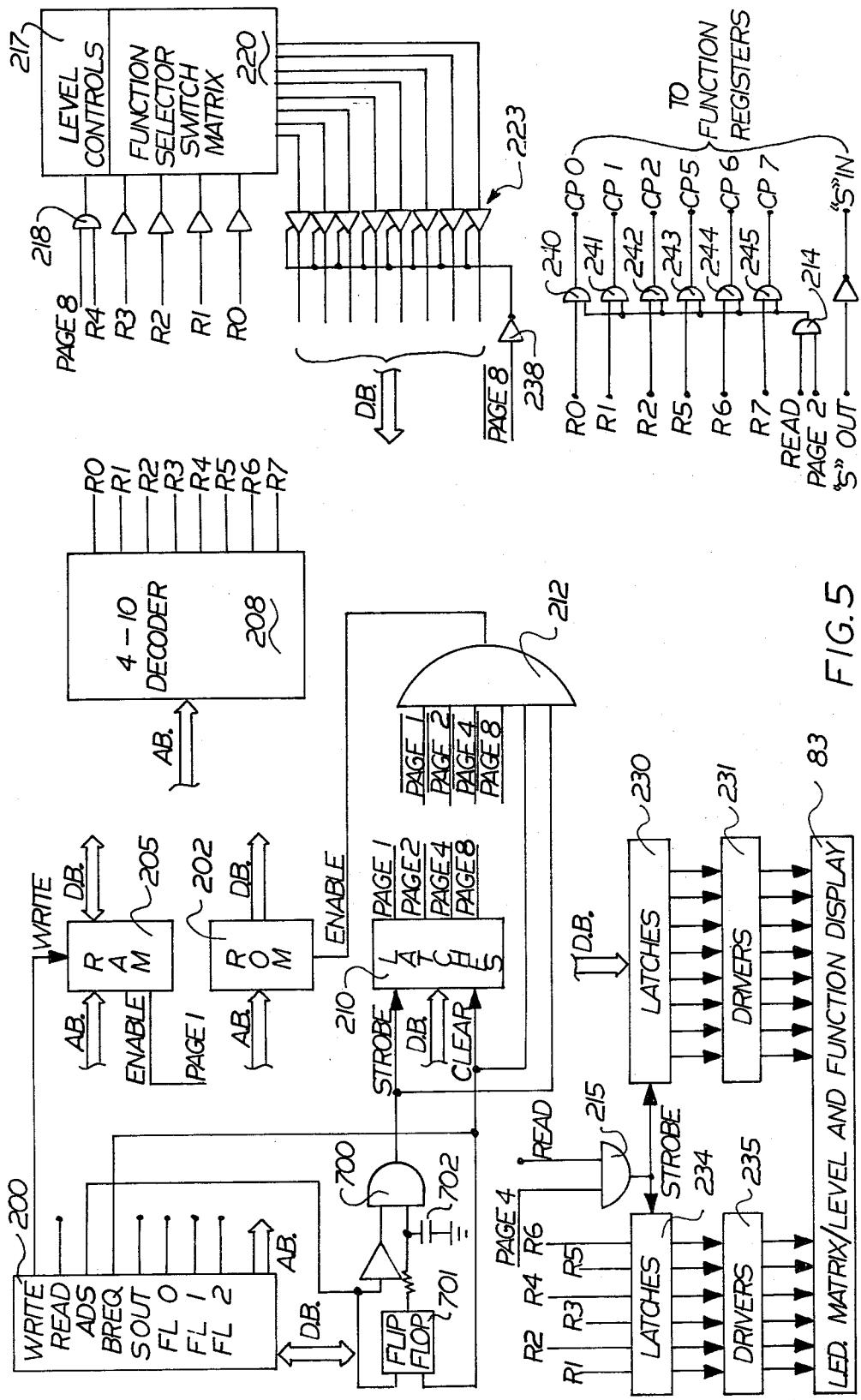
FIG. 5 is a block diagram of a microprocessor system employed to implement control and memory operations in an audio receiver embodying the present invention.

As mentioned above, control system 80 (FIG. 2) receives function and level information and provides it for display and updates the various registers as to changes in functions and levels selected. A control system embodying a microprocessor is shown in FIG. 5. It will be appreciated that the functions of the control system 80 could be implemented by "hard wired" circuits not employing a microprocessor.

Referring now to FIG. 5, the control system includes a central processing unit (CPU) 200 which communicates with other control system elements by means of an address bus AB, a data bus DB and a control bus including control lines for WRITE, READ, address strobe (ADS) and bus request (BREQ) signals. CPU 200 also includes a terminal, S. OUT, for providing output information in serial form and three terminals for providing "flag" output signals, FL0, FL1 and FL2. In the embodiment specifically described, CPU 200 is a SC/MP II microprocessor manufactured by National Semiconductor Corporation.

CPU 200 communicates via buses AB and DB with a read only memory (ROM), which stores the program instructions to be followed by the CPU, and a read-write working memory (RAM) 205. The RAM stores the register addresses of the functions and the setting of the variable functions as well as other data utilized by the CPU in performing its control function. Since the RAM is a volatile memory, power is maintained to it by means of a charged capacitor or similar circuit when the total device is in the OFF mode. The CPU also addresses particular external circuits such as the registers via bus AB and a decoder 208. Bus AB has a capacity of 12 bits and bus DB a capacity of 8 bits. Also, four (4) additional high order address bits are time-multiplexed on bus DB and are available during an ADS signal. These bits are strobed into latches 210 by an ADS signal after the latches are cleared by a BREQ signal and are used for device selection. The circuit including gate 700, flip-flop 701 and capacitor 702 is employed to insure that address bits on bus DB are strobed into latches 210 only by the first ADS signal following a BREQ signal. The BREQ signal sets flip-flop 701 which enables gate 700. The first ADS signal resets flip-flop 701 but gate 700 remains enables for a delay period provided by capacitor 702 and passes the ADS signal to latches 210. Any subsequent ADS signal are blocked until the next BREQ signal.

The outputs from latches 210 are identified as PAGE 1, PAGE 2, PAGE 4, PAGE 8 and PAGE 0 when all of PAGES 1 to 8 are 0. PAGE 0 selects ROM 202 through gate 212 and PAGE 1 selects RAM 205. PAGE 2 selects the function registers as a group through gate 214 and individual registers can then be addressed through decoder 208. PAGE 2 also selects the digital display 28 as discussed below. PAGE 4 selects the level and function display 83 through gate 215. PAGE 8 selects level control 217 through gate 218 and function selector switch matrix 220 for interrogation by the indicated signals from decoder 208. Data as to selected functions and levels are loaded on bus DB through tri-state logic elements 223 which are enabled by the PAGE 8 signal through an inverter 238.

In operation, the registers (FIGS. 3a to 3c) store the level and function information required for operation of the receiver until a change is made from control panel 10 in either function or level. The CPU 200 alternately addresses the level and function display 83 to drive the display of the selected functions, the digital display 28 (FIG. 1) as discussed below and the level and function selector switch matrix 220 and level control 217 to determine any change in the functions or levels selected.

The level and function display 83 is a matrix of light emitting diodes (LED) of six rows and eight columns. Data as to selected functions and level are supplied to the columns from bus DB through column latches 230 and drivers 231. The display matrix rows are addressed by the indicated outputs from decoder 208 through row latches 234 and drivers 235. The row and matrix latches are loaded on a READ signal from CPU 200. The setting for volume is displayed on scale 25 (FIG. 1) as a line of length proportional to the volume. The settings for balance, bass, midrange and treble are indicated by the position of a pair of LEDs "walking" along scale 25 with zero at the center.

The selector switches 220 and level control 217 are also arranged as a matrix with the level control output lying in one row of the matrix. The rows are addressed in sequence by the signals from decoder 208. Level change and selector switch data are placed on bus DB through the tri-state logic elements 223. When the level and selector switch matrix is not addressed the logic elements 223 are held in their high impedance state through driver 238.

When a change in selected function is detected, the identity of the selected function is stored in RAM 205, the appropriate function register is updated through the S. OUT control line and the new function is displayed. When a change in level is detected, the existing level is obtained from RAM 205 and adjusted. The adjusted level is provided to the appropriate function register and to the function and level display to implement and display the level adjustment.

A preferred form of level control 217 is shown in FIGS. 6a to 6e. Level selector knob 22 is not connected mechanically to any device but is rotatable endlessly on its shaft. As shown in FIGS. 6a and 6b, knob 22 is provided on its inner surface with a series of alternate reflecting segments 260 and nonreflecting segments 262. Only 8 reflecting and nonreflecting of each type of segment are shown in FIG. 6a but preferably there would be a substantially greater number, for example, 64 of each type. As shown in FIG. 6b, a pair of phototransistors 265, 266 are arranged adjacent to level selector knob 22 so as to receive light reflected from the segments 260 and 262. A pair of light sources such as light emitting diodes 270 and 271 are arranged to direct light onto the segments. The phototransistors 265, 266 are turned on and off as the light is reflected and absorbed by the segments 260 and 262 passing the phototransistors in sequence.

The phototransistors are arranged in the circuit of FIG. 6c so that they are turned on and off with a 90° phase displacement between their respective signals. As shown in FIG. 6d, when level selector knob 22 is turned in the decrease direction indicated by the arrow in FIG. 6b, signal 265a from phototransistor 265 leads signal 266a from photo transistor 266. When level selector knob 22 is turned in the increase direction signal 266a leads signal 265a as shown in FIG. 6e. The signals from transistors 265 and 266 utilized to provide pulses to flip-flop 280 and 281 in FIG. 6c. When level selector knob 22 is turned in the increase direction a pulse is provided to set flip-flop 280. Flip-flop 281 is set when the level selector knob is turned in the decrease direction.

Phototransistors 265 and 266 are connected as shown in FIG. 6c to provide more positive signals at the outputs of drivers 285 and 286, respectively, when conducting and to provide a less positive signal when not conducting. Signal 265a (FIGS. 6d and 6e) appears at the output of driver 285 and signal 266a at the output of driver 286. It will be seen from FIGS. 6d and 6e that a negative transition of signal 265a while signal 266a has a positive level occurs only when level selector knob 22 is being turned in the decrease direction (FIG. 6d). Correspondingly, it will be seen from FIG. 6d and 6e that a negative transition of signal 266a while signal 265a has a positive level occurs only when selector knob 22 is being rotated in the increase direction. These two combinations of signals set the respective "down" flip-flop 281 and "up" flip-flop 280.

The outputs of flip-flops 280 and 281 are connected to bus DB through tri-state logic elements 315 and 316. A unit increase in level appears at the output of element 315 and a unit decrease at the output of element 316. During each interrogation of the level control tri-state logic elements 315 and 316 are enabled through gate 218 (FIG. 5) to connect flip-flops 280 and 281 to bus DB. At the end of each interrogation, the flip-flops are cleared by a pulse derived from the trailing edge of the enable signal from gate 218 through capacitor 320.

Each unit level change obtained from flip-flops 280 or 281 is added to or subtracted from the previous level by CPU 200 and the new level for the given function is provided to the appropriate registers and also stored in RAM 205 and displayed by the level and function display as described above. The level control is interrogated at such frequent intervals that no unit increase in level will go undetected.

Figure 7:
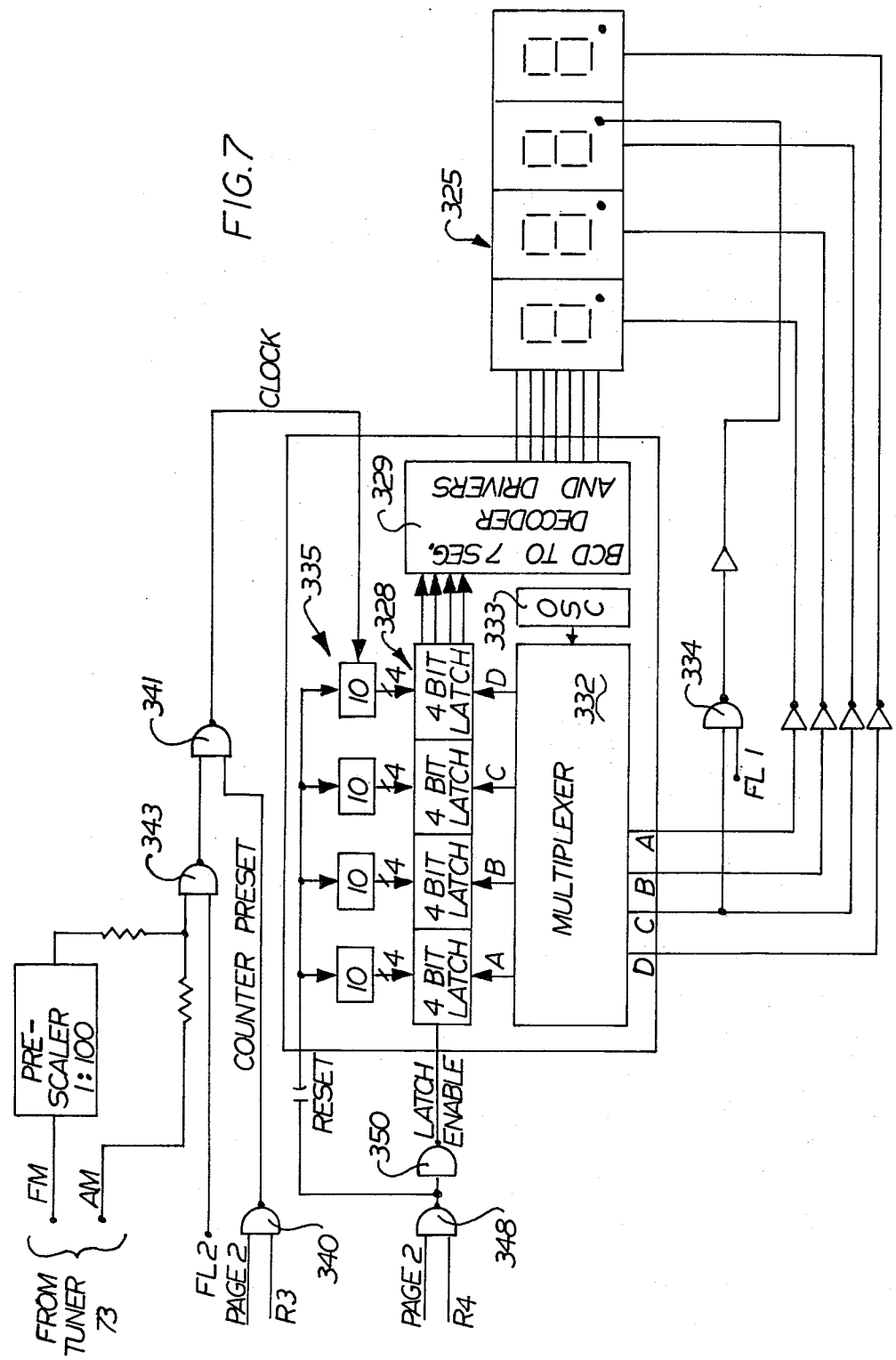
FIG. 7 is a block diagram of a circuit for displaying the selected frequency of an AM or FM tuner in an audio receiver embodying the present invention.

As shown in FIG. 7, the display of AM or FM frequency preferably includes a four digit, seven segment LED display 325 with decimal point. Frequency information is provided to the display from latches 328, one for each digit, through a decoder and driver 329. The latches 328 are connected in sequence to the appropriate digit of display 325 by a multiplexer 332 driven by an oscillator 333. The decimal point indication for display 325 is driven by the FL1 signal from CPU 200 through gate 334. The latches 328 are loaded from counter 335 which obtains a count indicating the tuner frequency in the manner described below.

As CPU 200 (FIG. 5) proceeds through its routine of scanning external devices, it will periodically address the frequency display and provide a burst of pulses through gates 340 and 341 to counter 335. The bursts may be of about 100 pulses each and are repeated until counter 335 is preset to a count of 9545 for AM or 9893 for FM, whichever is selected. The FL2 signal from CPU 200 enables gate 343 for a short precise time period of, for example, 1 millisecond. Either the AM or FM tuner oscillator, whichever is selected, provides pulses during this period through gates 341 and 343 to counter 335. The rate of the pulses from the FM oscillator is divided by 100 in a prescaler 345. Counter 335 spills over after counting oscillator pulses from the set count to the intermediate frequency for AM or FM, whichever is selected. In other words, the difference between the preset count and the spillover or clear condition of counter 335 corresponds to the intermediate frequency which is 10.7 MHz for FM and 455 KHz for AM. After spillover, counter 335 continues to count oscillator pulses for the period of FL2. The count stored at the end of FL2 corresponds to the carrier frequency of the radio transmitter to which the receiver is tuned. The contents of counter 335 are loaded into latches 328 for display by a signal from gate 348. Counter 335 is cleared on the trailing edge of the signal from gate 348.

As mentioned above, the microprocessor system of FIG. 5 operates according to the program stored in ROM 202. Appendix A is a printout in hexadecimal code of the program instructions stored in the ROM. The "9" in the most significant digit of the instruction address is meaningless and should be ignored. The ROM has a capacity of 2048 bytes. The instructions in Appendix A are part of the standard instruction set for the SC/MP II microprocessor manufactured by National Semiconductor Corporation. The instruction set and complete information pertaining to it are set forth in publications which are available from National Semiconductor Corporation. Accordingly, the complete instruction set will not be set forth herein.

Appendix B is a chart showing the correspondence between the flow diagrams of FIGS. 8-14 and the program of Appendix A. For each of FIGS. 8-14, the reference numerals of the blocks in the flow diagram are listed along with the ROM addresses of the program instructions which implement the functions in the corresponding block.

The operation of the audio receiver of FIGS. 1-7 will be described with reference to the flow diagrams of FIGS. 8-14.

Figure 8:
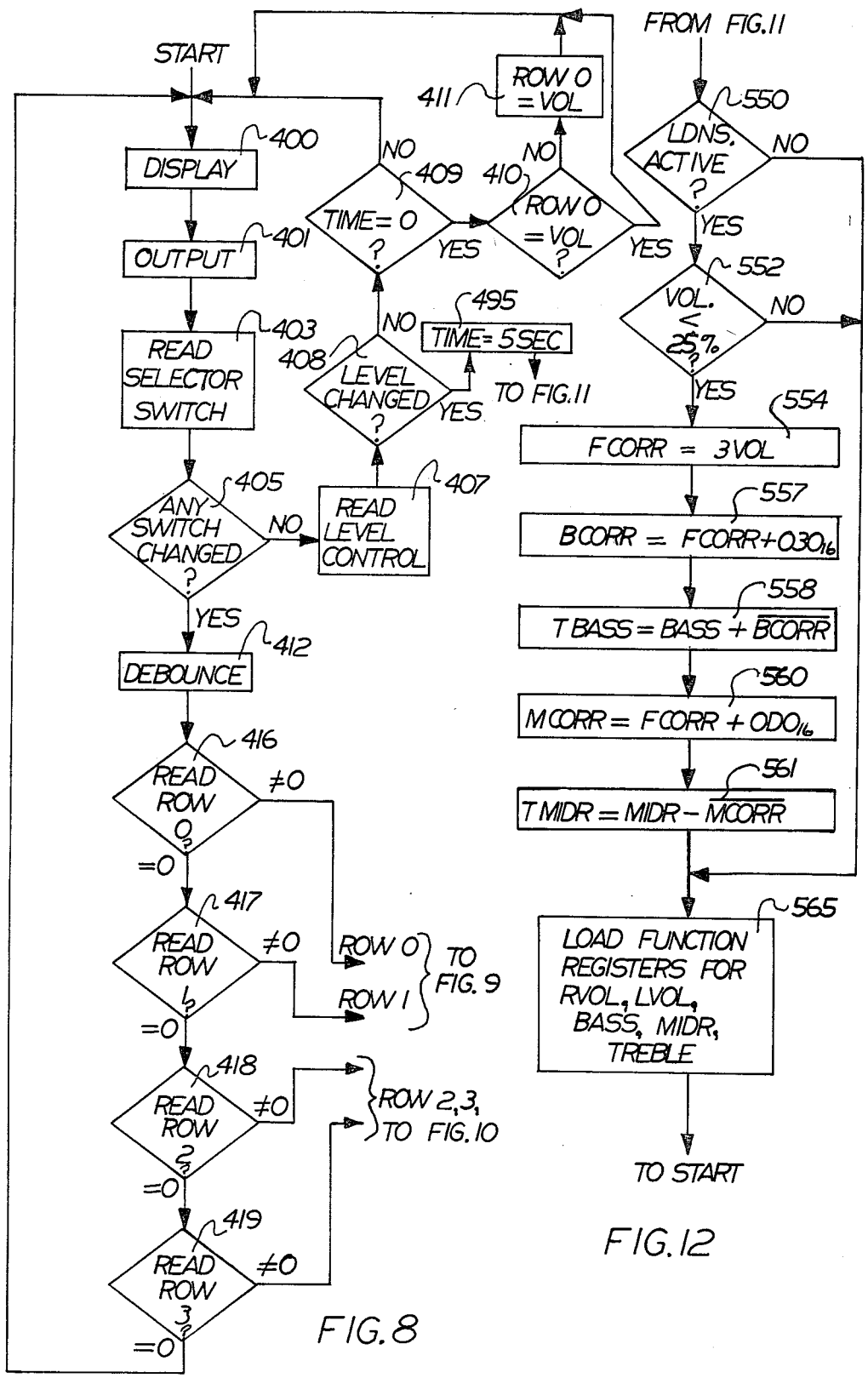

Referring initially to FIG. 8, in its usual operation the receiver is stepped in sequence through a display routine indicated at block 400, an output routine in block 401, each of which will be described below, and a scanning routine beginning at block 403 in which the function selector switches are scanned. If no switch has been changed since the previous scan as tested at block 405 the level control is read at block 407. If the level has not changed as tested at block 408 a procedure is invoked at blocks 409-411 to set the selected variable function to volume if it is not already set to volume and, if a 5 second time period has elapsed since a different variable function was either selected or adjusted. The program then returns to START.

If a selector switch change is detected at block 405, a debounce routine 412 is employed to eliminate the possibility of it being noise or spurious signals. The rows of the function selection switch matrix 220 (FIG. 5) are then interrogated in sequence to determine which row contains the operated switch as indicated at blocks 416 to 419. If no switch change is detected in any of the rows of the matrix, the program returns to the starting point. Normally, however, the row containing the operated switch is determined and the program then proceeds to FIG. 9 or 10 to determine which particular function is changed.

Figure 9:
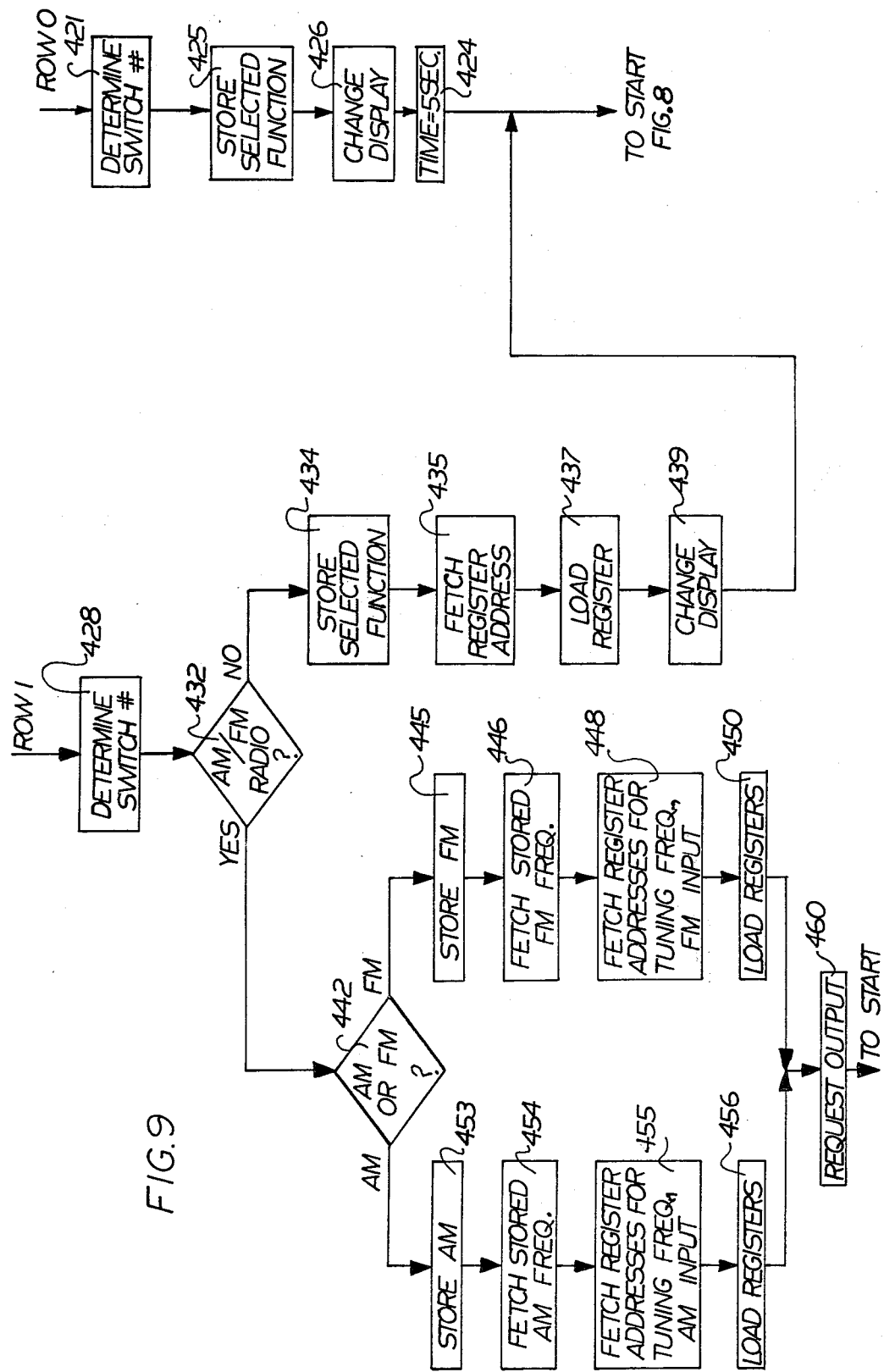
Figure 10:
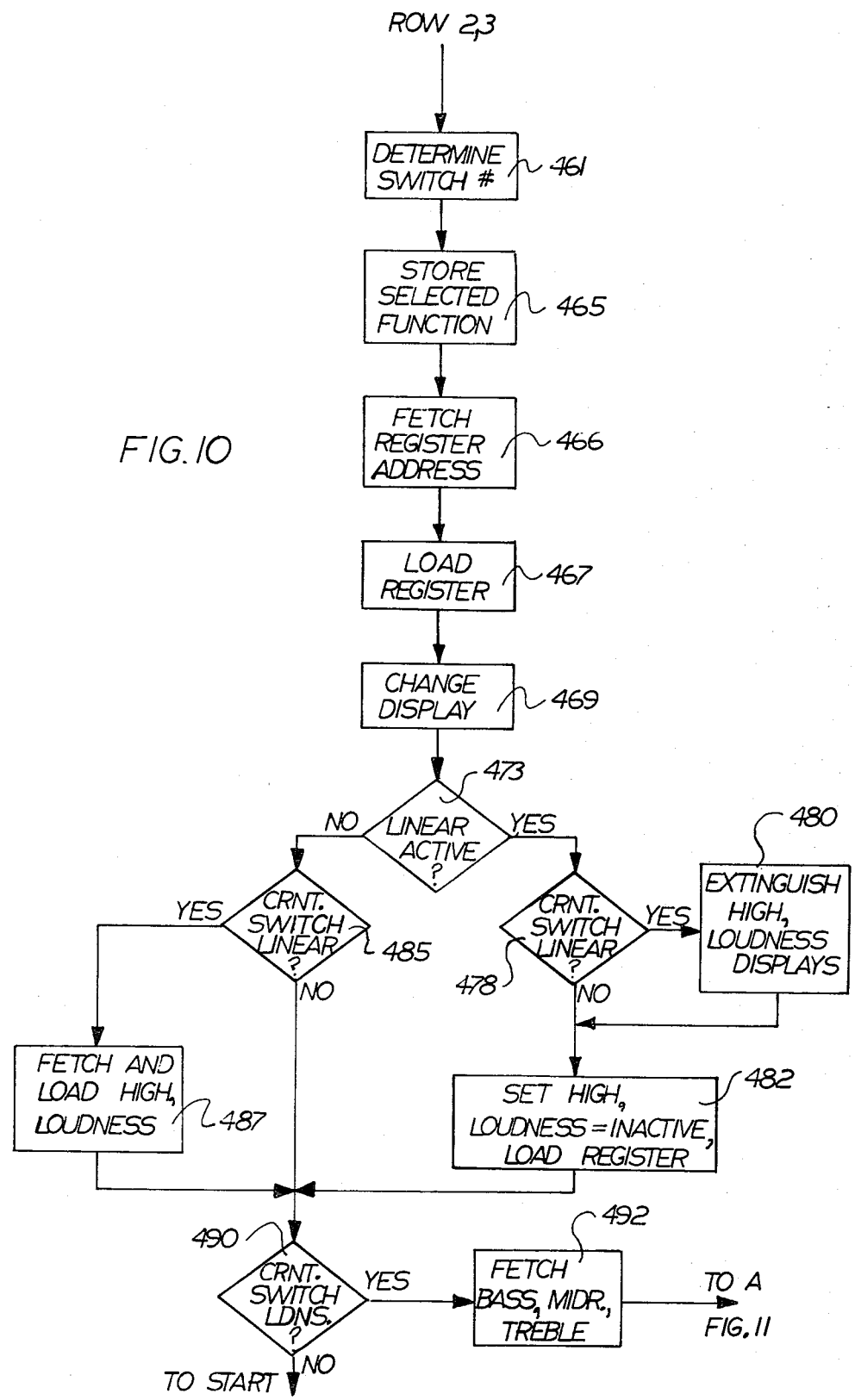

With reference to FIGS. 9 and 10, the rows of the selector switch matrix 220 (FIG. 5) in the specific embodiment described herein are arranged such that row 0 includes all of the switches for the variable functions and row 1 contains the switches for AM and FM radio selection as well as other on/off functions. Row 2 contains several on/off functions and Row 3 contains the linear and loudness functions as well as others.

Referring now to FIG. 9, if the switch operated is in row 0, the selected function is determined at block 421. The selected function is stored in RAM 205 and the display changed appropriately as indicated at blocks 425 and 426. The time function is set to 5 seconds at block 424. The program sequence then returns to the starting point.

When the operated switch is in row 1 and has been identified at block 428, it is tested at block 432 to determine if it involves the AM/FM radio. If not, the function change is stored at block 434, the address of the register for the function is fetched from RAM as indicated at block 435 and the function change is loaded into the register as indicated at block 437. The function display is then changed as indicated at 439 and the program returns to the starting point.

If the selected function involves the AM/FM radio it is tested at block 442 to determine whether AM or FM has been selected. If the selected function is FM, the selection is stored at block 445 and the stored FM frequency for the station playing when the FM radio was last selected is fetched from RAM 205 at block 446 along with the addresses of the registers for tuning frequency and FM input as indicated at block 448. The registers are then loaded serially in the manner described above as indicated at block 450.

If the selected function is AM radio, substantially the same sequence of events occurs with the exception that AM frequency and the AM input are involved as indicated at blocks 453 to 456. In the case of either AM or FM selection a flag is set to request output as indicated at block 460 and the program sequence returns to START.

Referring now to FIG. 10, when the selected function is determined to be in row 2 or 3 and has been identified at block 461, the function is stored, its register address is fetched from RAM 205 and the register is loaded as indicated at blocks 465 to 467. The level and function display is then changed to display the selected functions as indicated at block 469. A test is then made at block 473 to determine if the function "linear" is active. If the linear function is active a test is made at block 478 to determine if the switch just operated was the linear switch. If yes, the linear function was just selected rather than cancelled and the display for the functions "HIGH" and "LOUDNESS" are extinguished at block 480 since neither of these functions can be active when the linear function is selected. The high and loudness functions are set inactive and the appropriate register loaded at block 482 whenever the linear function is presently active as determined at block 473.

If the linear function is not presently active as determined at block 473, a test is made at 485 to determine if the switch just operated was the linear switch. If it was, then the linear function was just cancelled and the high and loudness functions are fetched from RAM and loaded into their respective registers as indicated at block 487.

If the switch just operated was not the linear switch, a test is made at block 490 to determine if it was the loudness switch. If not, the program returns to the starting point in FIG. 8. If yes, the bass, midrange and treble level settings are fetched from RAM as indicated at 492 and the program proceeds to point A in FIG. 11 to correct the level settings for loudness in a manner to be described below.

Figure 6:
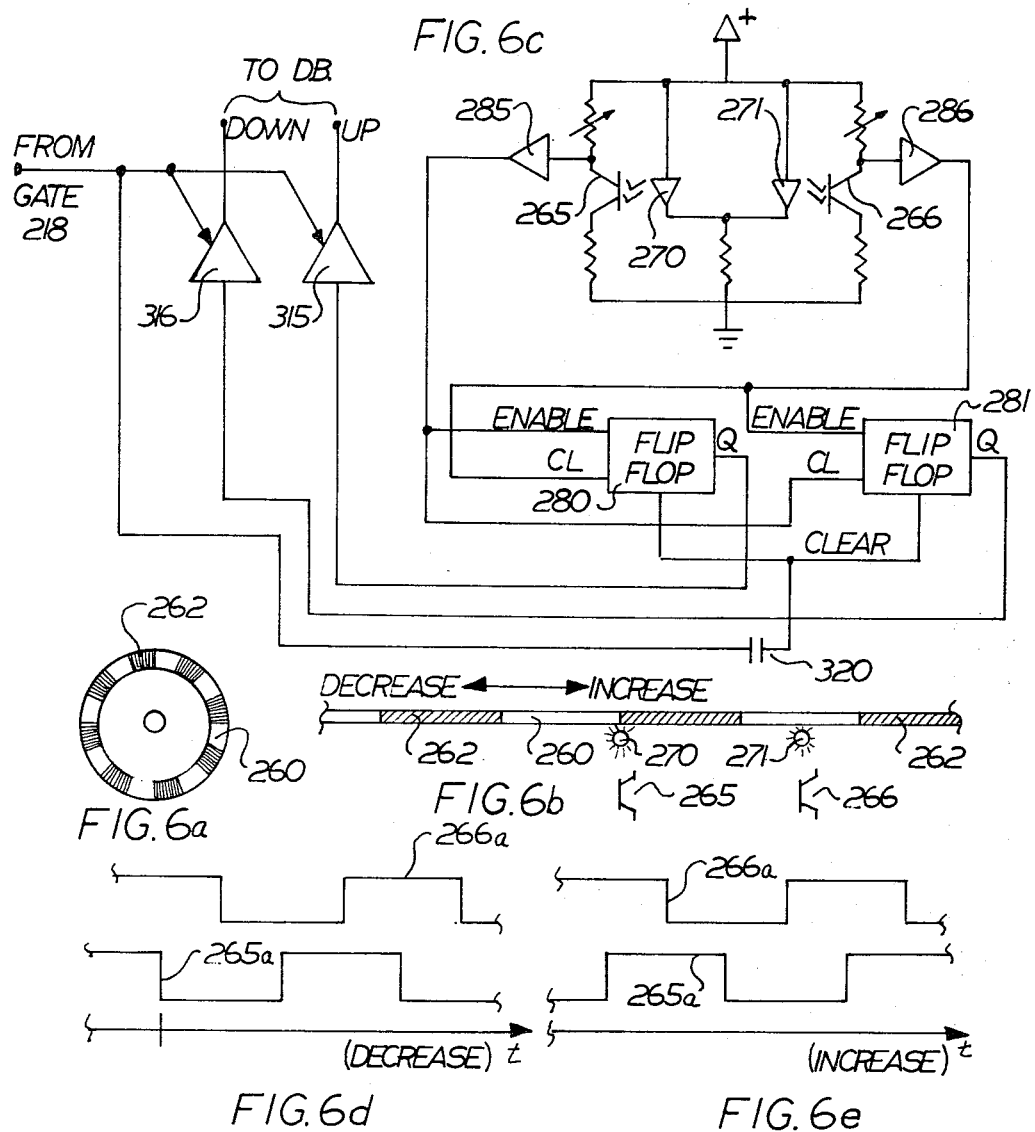
FIGS. 6a to 6e are diagrams illustrating the structure and operation of a level control in an audio receiver embodying the present invention.

Referring again briefly to FIG. 8, if a level change is detected at block 408 during the scanning sequence, the 5 second timing function is activated at block 495 and the program proceeds to the steps illustrated in FIG. 11. As shown there, the active variable function is determined at block 500 and its existing level fetched from RAM 205 at block 501. If the level change from the level control of FIG. 6 is up, the change is added to the previous level. If it is down, it is subtracted from the previous level and the new level is stored, all as indicated at blocks 504, 506, 508 and 510. The program then proceeds to make any other level adjustments which are desirable in view of the commanded level change.

If the adjusted function is volume or balance as indicated at block 515, then the left and right channel volume settings are to be adjusted to take into account both the volume and balance settings and the change in either of them. The volume and balance settings are fetched from memory at block 516 and a value TVOL is calculated at block 518 as the product of the volume setting VOL and the balance setting BAL. If the balance setting, BAL, is equal to or less than 50% as indicated at block 521, then the volume in the right channel, RVOL, is set equal to VOL while the volume in the left channel, LVOL, is set equal to twice TVOL as indicated at block 522. If the balance setting, BAL, is greater than 50%, then the volume setting in the left channel, LVOL, is set equal to VOL and the right channel volume, RVOL, is set equal to the value indicated at block 525.

An inspection of the equations in blocks 518 to 525 will indicate that the volume settings in the left and right channels will be equal to the volume setting, VOL, if balance is set at 50%. If, however, balance is set at, for example, 25% then the volume in the right channel will still be set equal to the volume setting VOL while the volume in the left channel, LVOL, will be set equal to $\frac{1}{2}$ of VOL.

If the level adjustment was in either bass or midrange as indicated at block 528, then the bass and midrange level settings are fetched from RAM 205 as indicated at block 531 and stored at block 532 for use in the sequence of FIG. 12. Similarly, if the level adjustment was for the treble function as indicated at block 534, the treble level setting is fetched as indicated at block 535 and stored.

If the adjusted function was tuning then the tuning register (FIG. 3C) is loaded with a new tuning frequency as indicated at block 537, the digital display is set for frequency rather than clock mode and the output request flag is set as indicated at block 538. The program then returns to the starting point.

FIG. 12 illustrates the corrections made to the various functions by the program to implement the loudness function. When the function adjusted in FIG. 11 was any one of volume, balance, bass or midrange or if the loudness function has just been selected then the program proceeds as shown in FIG. 12 to implement the loudness correction. Basically, if the loudness function is active rather than inactive the bass level is raised and the midrange level is lowered when the volume is decreased. The bass and midrange levels are changed in the opposite directions from those indicated for an increase in volume. Referring to FIG. 12, if the loudness function is not active as indicated at block 550 the loudness correction is not implemented. Too, if the volume setting is greater than 25% then the loudness correction is not necessary and is bypassed as indicated at block 552. If the test in both blocks 550 and 552 are met, however, a value FCORR is calculated as equal to 3 times the volume setting, VOL. A bass correction, BCORR is then calculated at block 557 as the sum of FCORR and a constant. A corrected bass setting, TBASS, is then calculated at block 558 as the sum of the uncorrected bass setting, BASS, and the complement of the bass correction BCORR at block 558. A midrange correction MCORR is calculated at block 560 as the sum of FCORR and a constant and a corrected midrange value, TMIDR, is calculated as the difference between the uncorrected midrange value, MIDR, and the complement of MCORR as indicated at block 561.

The function registers for the functions which had their levels adjusted, either by the level control of FIG. 6 or by correction, are then loaded with the adjusted levels as indicated at block 565 and the program returns to the starting point.

Figure 13:
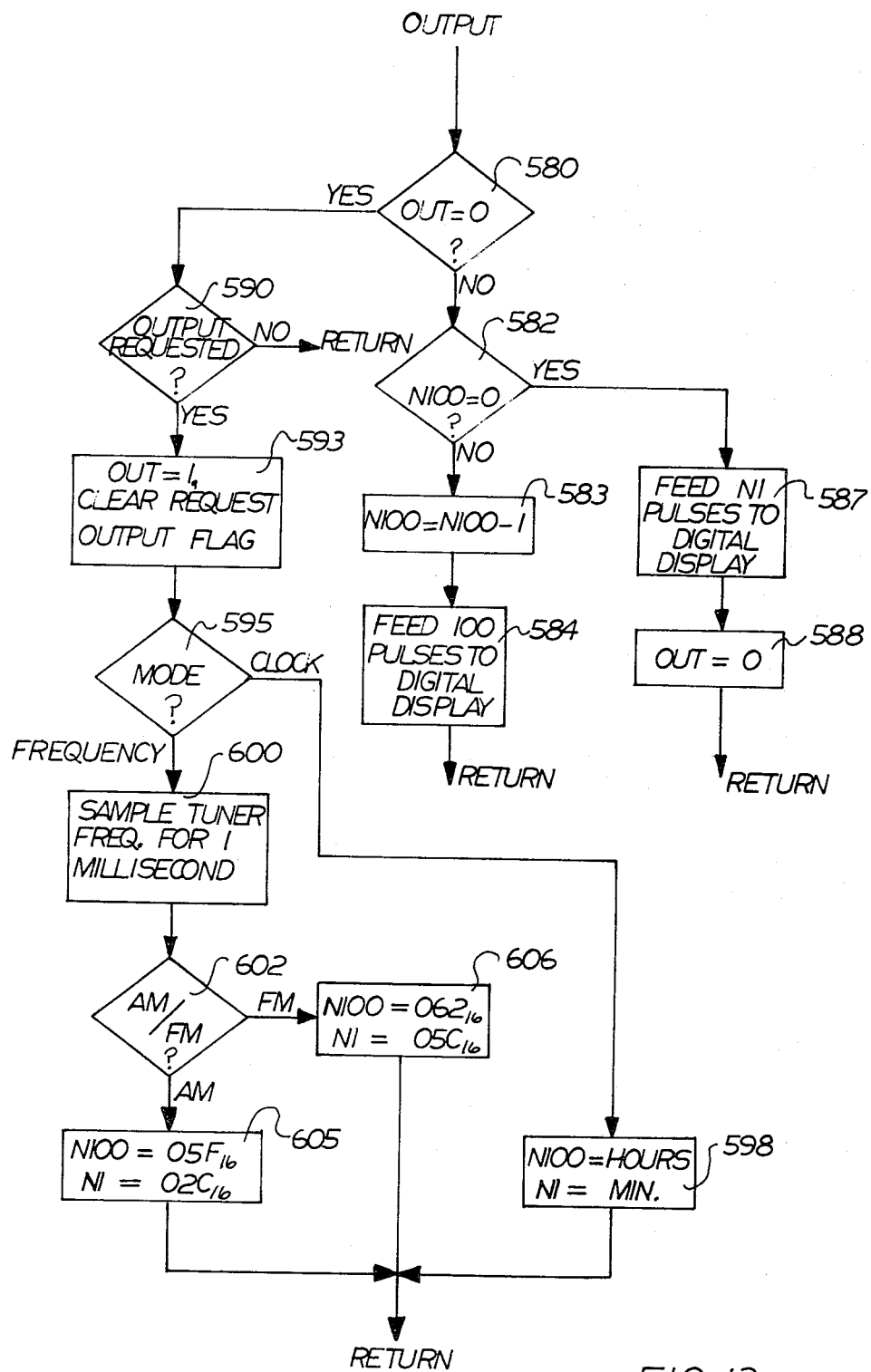

Referring again briefly to FIG. 8, the routine indicated at block 401 as OUTPUT is illustrated in more detail in FIG. 13. The purpose of this routine is to load the digital display of FIG. 7 with information either as to the frequency of a selected radio station or the time of day.

Referring to FIG. 13, each time the OUTPUT routine is entered an "out" flat stored in RAM 205 is tested as indicated at block 580. If not equal to 0 another value, N100, in RAM is tested to determine if the value is equal to 0 as indicated at block 582. If not, N100 is decremented, 100 pulses are fed to counter 335 (FIG. 7) as indicated at blocks 583 and 584 and the program continues as in FIG. 8. If the test of block 582 indicates that N100 is equal to 0, then a number of pulses corresponding to a value N1 in RAM are fed to counter 335, the "out" flag is set to 0 as indicated at blocks 587 and 588 and the program is returned to its sequence in FIG. 8. Counter 335 in FIG. 7 will then have been preset to an appropriate value to display AM or FM frequency setting or the time of day.

When the OUTPUT routine is subsequently entered, the test at block 580 indicates that the "out" flag is 0 and a test is made at block 590 to determine if the output request flag has been set. This flag is set, for example, when the digital display must be changed from frequency to clock or vice versa, or to indicate a change in tuning frequency. The output request flag is set at block 460 in FIG. 9 and at block 540 in FIG. 11. If the output request flag has not been set, the OUTPUT routine is terminated and the sequence of FIG. 8 resumed.

If the output request flag has been set, the out flag of block 580 is set to 1 and the output request flag is cleared as indicated at block 593. A test is then made at block 595 to determine whether clock mode or frequency mode is active for the display according to the selected audio input source. If clock mode is active, N100 and N1 are loaded with the hour and minute of the day as indicated at block 598. The digital display will then be set to indicate the time of day.

If frequency mode is active, the tuner frequency is sampled for one millisecond by setting flag 2 for that time period to enable gate 343 (FIG. 7) as indicated at block 600. Counter 335 in FIG. 7 will then contain the correct frequency for display. A test is then made at block 602 to determine if the signal is AM or FM. If FM, the N100 value in RAM is set to a hexadecimal count of 062 at block 606 and N1 is set to a hexadecimal count of 05C. This total count corresponds to decimal 9893 which is to be preset into counter 335 in FIG. 7 for indication of an FM tuning frequency as described above. Similarly, if the signal is AM, N100 and N1 are set as indicated at block 605 to a count of 9545 decimal which is to be preset into counter 335 for indication of an AM tuning frequency.

The DISPLAY routine indicated generally at block 400 in FIG. 8 is illustrated in greater detail in FIG. 14. As shown there, the display routine is entered at block 620 by decrementing a value LG, where LG is the row number of the LED matrix in the function and level display. Rows 1 and 2 of the matrix are arranged as the level display 25 (FIG. 1), while rows 3-6 are arranged to indicate the selected functions. After being decremented, LG is tested at block 622 to determine whether or not it is 0, which would indicate that no LED row is active. If LG is 0, it is set to 6 as indicated at block 625. The LED matrix row corresponding to LG is then enabled as indicated at block 626 and the program returns to the sequence of FIG. 8.

While a microprocessor system has been disclosed herein as the control system for an audio receiver or other electronic device embodying the present invention, it will be apparent to those skilled in the art that hard wired circuits may be employed which perform functions equivalent to those described above performed by the disclosed microprocessor system. Accordingly, this invention is not to be limited to the use of a microprocessor system for control purposes nor in any other way inconsistent with the progress in the art promoted by the invention.

APPENDIX A

| | | | | | | | | | | | | | | | | |
|---|---|---|---|---|---|---|---|---|---|---|---|---|---|---|---|---|
| 9000 | 08 | C4 | 07 | 37 | C4 | A1 | 33 | 3F | C4 | 00 | 07 | C9 | 31 | C9 | 32 | C9 |
| 9010 | 2B | C9 | 2C | C9 | 17 | C4 | 06 | 36 | C4 | 07 | 31 | 32 | 3E | 3F | C4 | 88 |
| 9020 | 32 | 3E | 3F | 3F | 3F | C1 | 21 | 9C | 4B | C4 | 02 | C9 | 21 | C1 | 39 | DC |
| 9030 | 02 | C9 | 39 | C1 | 03 | D4 | 1F | 98 | 11 | C1 | 17 | D4 | 02 | 9C | 0B | C1 |
| 9040 | 17 | DC | 02 | C9 | 17 | C4 | 07 | 31 | 32 | 3E | 3F | C1 | 0B | 98 | 0A | C4 |
| 9050 | DB | 33 | 3F | 01 | C1 | 80 | 01 | 90 | 17 | 32 | 3E | C4 | 01 | 31 | 3E | 3F |
| 9060 | C1 | 0F | 98 | 10 | C4 | 00 | C9 | 0F | C4 | 01 | C9 | 06 | C1 | 25 | 01 | 03 |
| 9070 | C4 | FF | 32 | 3E | 3F | C4 | 80 | 35 | C1 | 00 | D9 | 01 | D9 | 02 | D9 | 03 |
| 9080 | 9C | 12 | C1 | 04 | 35 | C4 | 10 | 35 | 98 | 0D | C9 | 0C | C4 | 16 | 31 | C4 |
| 9090 | 03 | 35 | 91 | FF | 3F | C4 | 01 | E1 | 22 | 98 | 39 | C9 | 22 | 3F | 8F | 02 |
| 90A0 | 3F | C4 | 80 | 35 | C1 | 00 | 9C | 32 | C1 | 01 | 98 | 09 | 01 | C4 | 01 | 35 |
| 90B0 | C4 | 56 | 31 | 91 | FF | C1 | 02 | 98 | 09 | 01 | C4 | 02 | 35 | C4 | 2B | 31 |
| 90C0 | 91 | FF | C1 | 03 | 98 | 09 | 01 | C4 | 02 | 35 | C4 | B4 | 31 | 91 | FF | 3F |
| 90D0 | C4 | 00 | C9 | 22 | 35 | C4 | 1D | 31 | 91 | FF | 01 | C4 | 10 | 32 | 3E | 01 |
| 90E0 | 32 | C1 | 17 | D4 | 01 | 98 | ED | C4 | 20 | 50 | 9C | 21 | 32 | 01 | C9 | 06 |
| 90F0 | 40 | C9 | 0F | C9 | 01 | 03 | C4 | 25 | 31 | C1 | 80 | 01 | C4 | FF | 32 |
| 9100 | 3E | C4 | 05 | C9 | 21 | C4 | 04 | 35 | C4 | 8C | 31 | 91 | FF | C4 | 00 | C9 |
| 9110 | 01 | C9 | 02 | C9 | 33 | C9 | 34 | C1 | 0F | 03 | FC | 05 | 9C | 18 | C4 | 06 |
| 9120 | C9 | 0F | C4 | FF | C9 | 06 | C4 | 03 | C9 | 39 | C1 | 03 | D4 | 1F | 98 | D1 |
| 9130 | C1 | 17 | DC | 02 | 90 | 16 | C1 | 16 | D4 | 06 | 98 | E2 | C4 | 02 | C9 | 39 |
| 9140 | C4 | 20 | C9 | 06 | C4 | 05 | C9 | 0F | C1 | 17 | D4 | FD | C9 | 17 | C4 | 07 |
| 9150 | 31 | 32 | 3E | 3F | 90 | AB | C4 | 10 | 32 | 3E | 01 | 9C | 1D | C1 | 17 | D4 |
| 9160 | FE | C9 | 17 | C4 | 03 | C9 | 39 | C4 | 05 | 36 | C4 | AF | 32 | 3E | C4 | 07 |
| 9170 | 31 | 3E | C4 | 00 | 35 | C4 | 1D | 31 | 91 | FF | C9 | 3F | C1 | 03 | D4 | 1F |
| 9180 | 9C | 10 | C1 | 05 | D4 | EF | D9 | 0A | C9 | 05 | C1 | 17 | D4 | EF | D9 | 0A |
| 9190 | C9 | 17 | 01 | 1C | C9 | 03 | D4 | 1F | 98 | 08 | C1 | 16 | D4 | 60 | DC | 02 |
| 91A0 | 90 | 18 | C1 | 05 | D4 | 10 | C9 | 0A | C1 | 05 | DC | 10 | C9 | 05 | C1 | 17 |
| 91B0 | DC | 10 | C9 | 17 | C1 | 16 | D4 | 60 | DC | 04 | C9 | 16 | C4 | 02 | C9 | 39 |
| 91C0 | C4 | 60 | D1 | 04 | C9 | 04 | C1 | 17 | D4 | 7D | C9 | 17 | C1 | 3F | C9 | 19 |
| 91D0 | 31 | C1 | 19 | 31 | C4 | 00 | 31 | C9 | 2A | 01 | 02 | C4 | 00 | 78 | C9 | 15 |
| 91E0 | C4 | 05 | 31 | 32 | 3E | C4 | 05 | 36 | C4 | AF | 32 | 3E | C4 | 06 | 31 | 3E |
| 91F0 | C4 | 07 | 31 | 3E | C4 | 04 | 35 | C4 | 8C | 31 | 91 | FF | C1 | 16 | D4 | 60 |
| 9200 | 58 | C9 | 16 | C9 | 04 | C1 | 17 | D4 | 7F | C9 | 17 | C1 | 03 | D4 | 60 | 98 |
| 9210 | 10 | C1 | 05 | D4 | EF | D9 | 0A | C9 | 05 | C1 | 17 | D4 | EF | D9 | 0A | C9 |
| 9220 | 17 | C4 | 03 | C9 | 39 | C4 | 00 | C9 | 03 | 90 | BA | C4 | 10 | 35 | C4 | 00 |
| 9230 | 31 | 40 | D4 | 01 | 98 | 05 | C4 | 08 | 01 | 90 | C1 | 40 | D4 | 02 | 98 | 05 |
| 9240 | C4 | 10 | 01 | 90 | B7 | 40 | D4 | 08 | 98 | 05 | C4 | 80 | 01 | 90 | AD | 40 |
| 9250 | D4 | 20 | 98 | 05 | C4 | 01 | 01 | 90 | A3 | 40 | D4 | 10 | 98 | 12 | C1 | 16 |
| 9260 | D4 | 60 | C9 | 16 | DC | 02 | C9 | 04 | C1 | 17 | DC | 80 | C9 | 17 | 90 | 9B |
| 9270 | 40 | D4 | 04 | 98 | 37 | C1 | 04 | D4 | 60 | 02 | F4 | 20 | 01 | C4 | 60 | 03 |
| 9280 | 78 | 9C | 01 | 01 | C1 | 04 | D4 | 9F | 58 | C9 | 04 | C1 | 16 | D4 | 9F | 58 |
| 9290 | C9 | 16 | 01 | 98 | 06 | C1 | 05 | DC | 01 | 90 | 04 | C1 | 05 | D4 | FE | C9 |
| 92A0 | 05 | C4 | 05 | 36 | C4 | AF | 32 | 3E | C4 | 06 | 31 | 3E | C4 | 04 | 35 | C4 |
| 92B0 | 8C | 31 | 91 | FF | C4 | 10 | 32 | 3E | C9 | 3F | 01 | C1 | 17 | D4 | 01 | 98 |
| 92C0 | 5C | C1 | 05 | 60 | C9 | 05 | D4 | 20 | 98 | 11 | 50 | 98 | 06 | C1 | 05 | D4 |
| 92D0 | 8C | C9 | 09 | C1 | 05 | D4 | 73 | C9 | 05 | 90 | 0D | C4 | 20 | 50 | 98 | 06 |
| 92E0 | C1 | 05 | D9 | 09 | C9 | 05 | C1 | 05 | D4 | 7C | 01 | C1 | 3F | 94 | 02 | 90 |
| 92F0 | 0E | C1 | 17 | D4 | 83 | 58 | C9 | 17 | C4 | 07 | 31 | 32 | 3E | 90 | AD | 02 |
| 9300 | C4 | 00 | F9 | 27 | D4 | F0 | 01 | C4 | 0F | D1 | 12 | 58 | C9 | 12 | C4 | 44 |
| 9310 | 31 | C4 | 04 | 35 | 91 | FF | 3F | C1 | 17 | D4 | 01 | 9C | 06 | C4 | 1D | 31 |
| 9320 | 35 | 91 | FF | C1 | 0C | D4 | 01 | C9 | 0D | C4 | 01 | C9 | 0C | C4 | 05 | C9 |
| 9330 | 21 | C1 | 0F | 01 | C4 | 05 | 78 | 98 | 0E | C4 | 94 | 08 | C4 | 04 | 35 | C4 |
| 9340 | 69 | 31 | 91 | FF | C4 | 04 | C9 | 0C | C4 | 25 | 31 | C4 | 6A | 32 | 3E | C4 |
| 9350 | 00 | 31 | C4 | 00 | C9 | 0D | 40 | 98 | 56 | 03 | FC | 01 | 98 | 4B | 03 | FC |
| 9360 | 01 | 9C | 08 | C4 | 04 | 35 | C4 | 05 | 31 | 91 | FF | 03 | FC | 01 | 9C | 08 |
| 9370 | C4 | 04 | 35 | C4 | 25 | 31 | 91 | FF | 03 | FC | 01 | 9C | 08 | C4 | 04 | 35 |
| 9380 | C4 | 3B | 31 | 91 | FF | 02 | C4 | 00 | F9 | 2A | C9 | 15 | C4 | 05 | 31 | 32 |
| 9390 | 3E | 3F | C4 | 19 | 31 | C1 | 00 | 01 | C1 | 11 | C9 | 80 | 3F | C4 | 02 | C9 |
| 93A0 | 39 | C4 | 04 | 35 | C4 | 8C | 31 | 91 | FF | C1 | 26 | 01 | 02 | 90 | 05 | 3F |

APPENDIX A-continued

| | | | | | | | | | | | | | | | | |
|---|---|---|---|---|---|---|---|---|---|---|---|---|---|---|---|---|
| 93B0 | C1 | 25 | 01 | 03 | C4 | FF | 32 | 3E | C1 | 25 | C9 | 3E | C1 | 26 | C9 | 3F |
| 93C0 | C4 | 3E | 31 | C4 | 2F | 32 | 3E | 3F | C1 | 26 | 94 | 1E | 03 | FC | 80 | 98 |
| 93D0 | 19 | C1 | 25 | D4 | FC | D9 | 31 | C9 | 11 | C1 | 25 | 03 | F9 | 3E | 02 | 01 |
| 93E0 | 40 | 70 | D4 | FC | D9 | 32 | C9 | 10 | 90 | 13 | C1 | 25 | D4 | FC | D9 | 32 |
| 93F0 | C9 | 10 | 02 | C1 | 3E | F1 | 3E | D4 | FC | D9 | 31 | C9 | 11 | C4 | 0D | 31 |
| 9400 | C4 | 05 | 35 | 91 | FF | 3F | C1 | 27 | 01 | 02 | C4 | FF | 32 | 3E | 02 | C4 |
| 9410 | 00 | F9 | 27 | D4 | F0 | 01 | C4 | 0F | D1 | 12 | 58 | C9 | 12 | C4 | 05 | 35 |
| 9420 | C4 | 0D | 31 | 91 | FF | 3F | C1 | 28 | 01 | 02 | C4 | FF | 32 | 3E | C1 | 28 |
| 9430 | 01 | C4 | 7C | 32 | 3E | C4 | F0 | D1 | 12 | 90 | DF | 3F | C1 | 29 | 01 | 02 |
| 9440 | C4 | FF | 32 | 3E | 3F | C1 | 29 | 01 | C4 | 7C | 32 | 3E | C4 | 03 | 50 | C9 |
| 9450 | 31 | 19 | 19 | 40 | C9 | 32 | C4 | FC | D1 | 10 | 58 | C9 | 10 | C1 | 31 | 01 |
| 9460 | C4 | FC | D1 | 11 | 58 | C9 | 11 | 90 | B4 | 3F | C1 | 0D | 98 | 0B | A9 | 2B |
| 9470 | 03 | F9 | 37 | 9C | 0D | C9 | 2B | 90 | 09 | A9 | 2C | 03 | FC | 3C | 9C | 02 |
| 9480 | C9 | 2C | C4 | 00 | C9 | 0D | C9 | 2D | C4 | 03 | C9 | 39 | 3F | C1 | 17 | D4 |
| 9490 | 01 | 98 | 0A | C4 | 00 | C9 | 0B | 35 | C4 | 1D | 31 | 91 | FF | C1 | 0B | 94 |
| 94A0 | 5C | C1 | 17 | DC | 01 | C9 | 17 | C4 | 07 | 31 | 3E | C4 | 06 | 31 | 3E | C4 |
| 94B0 | 05 | 31 | 3E | C4 | 02 | 31 | 3E | C4 | 01 | 31 | 3E | C4 | 00 | 31 | 3E | 3F |
| 94C0 | C4 | 04 | C9 | 0B | C4 | 02 | C9 | 21 | C4 | 64 | C9 | 36 | C4 | 18 | C9 | 37 |
| 94D0 | 06 | D4 | 20 | 01 | 06 | 60 | D4 | 20 | 98 | FA | 8F | 00 | 06 | 60 | D4 | 20 |
| 94E0 | 98 | F2 | C4 | BB | 8F | 1E | 06 | 60 | D4 | 20 | 98 | 08 | C4 | 78 | C9 | 36 |
| 94F0 | C4 | 0C | C9 | 37 | C4 | 01 | C9 | 06 | 1C | C9 | 0F | 90 | 9A | C4 | 08 | C9 |
| 9500 | 25 | C4 | FF | C9 | 0B | C4 | AF | 31 | C4 | 03 | 35 | 91 | FF | 3F | C1 | 05 |
| 9510 | 94 | 63 | C1 | 25 | 94 | 02 | 90 | 5D | 02 | F1 | 25 | 94 | 02 | 90 | 56 | F1 |
| 9520 | 25 | C9 | 3F | F4 | 30 | 01 | 06 | 94 | 03 | C4 | FF | 01 | C1 | 27 | 02 | 78 |
| 9530 | 01 | 06 | 94 | 03 | C4 | FF | 01 | C4 | 00 | 02 | 78 | D4 | F0 | 01 | C1 | 12 |
| 9540 | D4 | 0F | 58 | C9 | 12 | C1 | 3F | F4 | D0 | 01 | 06 | 94 | 03 | C4 | FF | 01 |
| 9550 | 01 | 03 | F1 | 29 | 01 | 06 | D4 | 80 | 9C | 01 | 01 | C4 | 7C | 32 | 3E | C4 |
| 9560 | 03 | 50 | C9 | 3F | 19 | 19 | C4 | FC | D1 | 10 | 58 | C9 | 10 | C4 | FC | D1 |
| 9570 | 11 | D9 | 3F | C9 | 11 | C4 | 00 | 32 | 3E | C4 | 01 | 31 | 3E | C4 | 02 | 31 |
| 9580 | 3E | C4 | 8C | 31 | C4 | 04 | 35 | 91 | FF | 00 | 87 | 00 | 88 | 00 | 00 | 20 |
| 9590 | 81 | 00 | 80 | 00 | 84 | 00 | 80 | 00 | 82 | 00 | 3F | C4 | 06 | 36 | C9 | 07 |
| 95A0 | C4 | 7A | 32 | C9 | 08 | C4 | 2A | C9 | 3D | C4 | 11 | 01 | 19 | 01 | C9 | 30 |
| 95B0 | 3F | C4 | 06 | 36 | C9 | 07 | C4 | 88 | 32 | C9 | 08 | C4 | 2A | C9 | 3D | C4 |
| 95C0 | 11 | 01 | 19 | 01 | C9 | 30 | C4 | 30 | 35 | C1 | 31 | B9 | 30 | 9C | FA | 3F |
| 95D0 | C4 | 88 | 32 | 3E | 3F | B9 | 3D | 9C | F6 | C4 | 01 | C9 | 21 | C1 | 07 | 36 |
| 95E0 | C1 | 08 | 32 | 90 | 1B | C1 | 00 | 19 | C1 | 00 | 19 | C1 | 00 | 19 | C1 | 00 |
| 95F0 | 19 | C1 | 00 | 19 | C1 | 00 | 19 | C1 | 00 | 19 | C1 | 00 | 06 | D4 | 01 | 07 |
| 9600 | 3E | C4 | 30 | 35 | 06 | DC | 02 | 07 | 02 | C4 | 00 | F9 | 10 | 01 | 19 | 90 |
| 9610 | D4 | C4 | 10 | 35 | C4 | 00 | 31 | C4 | 80 | 01 | 98 | 13 | C9 | 3F | C4 | 08 |
| 9620 | C9 | 3E | B9 | 3E | 40 | D1 | 3F | 9C | 03 | 19 | 90 | F6 | C1 | 3E | 01 | 3E |
| 9630 | C1 | 00 | 01 | C4 | 00 | C9 | 00 | C4 | 08 | C9 | FF | 40 | D4 | 01 | 02 | 98 |
| 9640 | 14 | C1 | 00 | F1 | 01 | 1F | C9 | 00 | 40 | 1F | 01 | B9 | FF | 9C | EC | 40 |
| 9650 | C9 | 01 | 3E | 90 | DB | C1 | 00 | 90 | EC | C1 | 80 | 02 | F1 | E7 | 35 | 06 |
| 9660 | 94 | 03 | C4 | FF | 35 | C4 | 10 | 35 | C9 | 80 | 3E | C1 | E8 | 98 | EA | C1 |
| 9670 | 80 | 03 | F9 | E7 | 35 | 06 | D4 | 80 | 9C | EB | 35 | 90 | E8 | 19 | 19 | 19 |
| 9680 | 19 | C4 | 00 | 02 | 78 | D4 | 0F | 01 | 3E | 06 | D4 | 20 | E1 | 2F | 98 | 2B |
| 9690 | 06 | D4 | 20 | C9 | 2F | A9 | 2E | 03 | F9 | 36 | 9C | 1F | C9 | 2E | B9 | 21 |
| 96A0 | A9 | 2D | 03 | FC | 3C | 9C | 14 | C9 | 2D | A9 | 2C | 03 | FC | 3C | 9C | 0B |
| 96B0 | C9 | 2C | A9 | 2B | 03 | F9 | 37 | 9C | 02 | C9 | 2B | C1 | 35 | 98 | 7A | C4 |
| 96C0 | 0A | C9 | 13 | C4 | 30 | 35 | C1 | 3A | 98 | 73 | B9 | 3A | A9 | 13 | B9 | 13 |
| 96D0 | A9 | 13 | B9 | 13 | 9C | F4 | B9 | 3E | 37 | C9 | 02 | 1F | 01 | C9 |
| 96E0 | 01 | 1D | C9 | 33 | 40 | C9 | 34 | C4 | 07 | 37 | C1 | 0F | 1C | 98 | 10 | C1 |
| 96F0 | 01 | D9 | 33 | C9 | 01 | C9 | 33 | C1 | 02 | D9 | 34 | C9 | 02 | C9 | 34 | 3E |
| 9700 | C4 | 10 | 35 | C4 | 00 | 31 | C4 | 0F | 50 | 08 | 08 | C9 | 18 | C9 | 0E | 19 |
| 9710 | 19 | 19 | 19 | 40 | C9 | 3F | 06 | 94 | 06 | C4 | FF | 01 | 40 | 90 | 05 | C4 |
| 9720 | 00 | 01 | C4 | 80 | 37 | C4 | 10 | 03 | F9 | 3F | C9 | 3F | B9 | 3F | 98 | A9 |
| 9730 | 37 | 02 | 1F | 01 | 1D | 01 | 37 | 90 | F3 | 8F | 01 | 90 | 1B | B9 | 3B | 94 |
| 9740 | 02 | 90 | 0A | C9 | 13 | 98 | 06 | B9 | 3B | C9 | 13 | 9C | FA | C9 | 14 | C4 |
| 9750 | 10 | 35 | C4 | 00 | C9 | 35 | 90 | A7 | C1 | 39 | D4 | 02 | 98 | A1 | C4 | 01 |
| 9760 | C9 | 35 | D1 | 39 | C9 | 39 | 9C | 25 | C4 | E4 | 07 | C4 | AB | 8F | 01 | C4 |
| 9770 | 00 | 07 | C1 | 03 | D4 | 1F | 98 | 0D | C4 | 01 | 07 | C4 | 62 | C9 | 3A | C4 |
| 9780 | 5C | C9 | 3B | 90 | D1 | C4 | 5F | C9 | 3A | C4 | 2C | 90 | F4 | C1 | 2B | C9 |
| 9790 | 3A | C4 | 00 | 07 | C1 | 2C | 90 | E9 | 01 | C4 | 50 | 35 | C1 | 80 | C4 | 10 |
| 97A0 | 35 | 3F | C4 | 10 | 35 | C4 | 00 | 31 | C1 | 17 | D4 | 01 | 98 | EA | B9 | 00 |
| 97B0 | 9C | E6 | C4 | 06 | C9 | 00 | 01 | B9 | 0E | 94 | DE | C4 | 0F | 03 | F9 | 18 |
| 97C0 | C9 | 18 | C9 | 0E | C1 | 33 | 01 | C1 | 01 | C9 | 33 | 40 | C9 | 01 | C1 | 34 |
| 97D0 | 01 | C1 | 02 | C9 | 34 | 40 | C9 | 02 | C4 | 06 | 90 | BC | C4 | 02 | C9 | 21 |
| 97E0 | B9 | 0B | 02 | F4 | 0B | 01 | C0 | 80 | C9 | 06 | C0 | 80 | C9 | 0F | F4 | 25 |
| 97F0 | 90 | AF | 08 | 10 | 04 | 02 | 03 | 04 | 02 | 01 | 02 | 03 | 04 | 02 | 01 | 04 |

APPENDIX B

CORRESPONDENCE CHART FLOW DIAGRAMS TO PROGRAM

| Block No. | ROM ADDRESS |
|---|---|
| | FIG. 8 |
| 400 | 1D, 22-24, 798-7DB |
| 401 | 1C-21 |
| 403 | 74-7F |
| 405 | 80-81 |

APPENDIX B-continued

CORRESPONDENCE CHART FLOW DIAGRAMS TO PROGRAM

| Block No. | ROM ADDRESS |
|---|---|
| 407 | 82-87 |
| 408 | 88-93 |
| 409 | 25-28 |
| 410 | 60-63 |
| 411 | 64-73 |

APPENDIX B-continued
CORRESPONDENCE CHART
FLOW DIAGRAMS TO PROGRAM

| Block No. | ROM ADDRESS |
|---|---|
| 412 | 94-A0 |
| 416 | A1-A7 |
| 417 | A8-B4 |
| 418 | B5-C1 |
| 419 | C2-CE |
| 495 | 32D-330 |
| FIG. 9 | |
| 421 | DA-DF, 611-62F |
| 425 | ED-F2 |
| 426 | F3-100, 6D9-738 |
| 424 | 101-104 |
| 428 | 156-15A, 611-62F |
| 432 | 15B-15C |
| 434 | 15D-162 |
| 435 | 16E-171 |
| 437 | 5E5-610 |
| 442 | 17C-181 |
| 445 | 192-1A1, 1BA-1BB |
| 446 | 1CC-1DF |
| 448 | 1E0-1F3 |
| 450 | 5E5-610 |
| 460 | 1BC-1BF |
| 453 | 192-1A1, 1BA-1BB |
| 454 | 1CC-1DF |
| 455 | 1E0-1F3 |
| 456 | 5E5-610 |
| FIG. 10 | |
| 461 | 22B-25D, 270-273, 2B4-2B7, 611-62F |
| 465 | 25E-263, 28B-291, 2F1-2F7 |
| 466 | 2A8-2AB, 2F8-2FC |
| 467 | 5E5-610 |
| 469 | 264-267, 275-28A, 295-2A0, 2C1-2C5 |
| 473 | 2C6-2C9 |
| 478 | 2CA-2CC |
| 480 | 2CD-2D8 |
| 482 | 2E6-2F6 |
| 485 | 2DB-2DF |
| 487 | 2E0-2E5 |
| 490 | 2EA-2EF |
| 492 | 2FF-314, 446-447 |
| FIG. 11 | |
| 500 | 331-343 |
| 501 | 348-34E, 659-65A, 66F-670 |
| 504 | 66B-66E |
| 506 | 65B-664 |
| 508 | 671-67C |
| 510 | 665-66B |
| 515 | 356-35D |
| 516 | 3B8-3BF |
| 518 | 3C0-3C6, 630-658 |
| 521 | 3C7-3CA |
| 522 | 3CB-3D5, 3D8-3E3 |
| 525 | 3EA-3EF, 3F2-3FA |
| 532 | 3D6-3D7, 3E4-3E5, 3F0-3F1, 3FB-3FC, 414-41C, 430-43A, 447-466 |
| 528 | 35E-36A, 378-384 |
| 531 | 40E-413 |
| 534 | 36B-377 |
| 535 | 412-413 |
| 537 | 385-39C |
| 540 | 39D-3A0 |
| FIG. 12 | |
| 550 | 50E-511 |
| 552 | 512-51E |
| 554 | 51F-522 |
| 557 | 523-52A |
| 558 | 52B-544 |
| 560 | 545-54E |
| 561 | 54F-574, 67D-688 |
| 565 | 575-580, 5E5-610 |
| FIG. 13 | |
| 580 | 6BB-6BE |
| 582 | 6C6-6C9 |
| 583 | 6CA-6CB |
| 584 | 6BF-6C5, 6CC-6D7 |
| 587 | 73D-74E |
| 588 | 752-755 |
| 590 | 758-75D |
| 593 | 75E-765 |
| 595 | 766-767 |
| 598 | 781-782, 78D-797 |
| 600 | 768-771 |
| 602 | 772-777 |
| 605 | 781-78C |
| 606 | 77B-784 |
| FIG. 14 | |
| 620 | 7AE-7AF |
| 622 | 7B0-7B1 |
| 625 | 7B2-7BC |
| 626 | 798-79D |

What is claimed is:

1. Apparatus for use in controlling a plurality of analog signal processing means, each responsive to an associated analog input signal for modifying an associated characteristic of said input signal to a variable extent, said apparatus comprising;

a plurality of control means, each associated with a corresponding one of said signal processing devices and responsive to an associated control signal for controlling the extent to which the associated characteristic of the associated analog input signal is modified by said corresponding signal processing device;

a single adjusting means for providing a manually controllable adjustment signal for adjusting the extent of input signal modification by any selected one of said signal processing means;

means for manually selecting one of said signal processing means for adjustment; and enabling means, responsive to the selection by said selecting means of one of said signal processing means for adjustment, for providing a control signal to the control means associated with the selected signal processing means for causing said extent of signal modification by said selected signal processing means to be varied in accordance with said adjustment signal provided by said adjusting means.

2. Apparatus as claimed in claim 1, wherein each of said control means is responsive to a corresponding said control signal provided thereto by said enabling means for establishing the extent of said input signal modification by the associated signal processing means, and wherein said enabling means includes a memory for storing signals defining the extents of signal modification by each of said signal processing means, and means for adjusting the stored signal associated with said control means of said selected signal processing means in accordance with said adjustment signal and for providing the adjusted stored signal to said control means.

3. Apparatus as claimed in claim 1 wherein each of said control means includes memory means for storing an electrical signal representing the extent of said input signal modification for controlling said modification extent.

4. Apparatus as claimed in claim 1 wherein said selecting means is biased to normally select a particular signal processing means for adjustment and is responsive to passage of a predetermined time after selection of a different signal processing means for causing selection of said particular signal processing means.

5. Apparatus as claimed in claim 1, further comprising display means, and wherein said enabling means is responsive to selection of a signal processing means for adjustment for causing said display means to display an indication of the extent of input signal modification by said selected signal processing means.

6. Apparatus as claimed in claim 1 wherein said adjusting means includes means for generating signals representing the magnitude and direction of a desired change in the extent of input signal modification, and means for storing said signals.

7. Apparatus as claimed in claim 6 wherein said signal generating means includes a rotatable knob, means for generating pulses having a predetermined phase difference in response to rotation of said knob, and means for providing said pulses to said storage means to enable storage of a signal for increasing the extent of modification by the selected signal processing device when said phase difference is in one direction and to enable storage of a signal for decreasing said extent of modification when said phase difference is in the opposite direction.

8. Apparatus as claimed in claim 6 wherein said storage means includes a first storage element for storing a signal indicating an increase in extent of modification and a second storage element for storing a signal indicating a decrease in extent of modification.

9. Apparatus for use in controlling a plurality of analog signal processing devices, each of which devices functions to modify an associated characteristic of an associated input signal to a variable extent, comprising: a plurality of electrically controllable means each associated with a corresponding one of said plurality of signal processing devices for setting the extent of the associated input signal modification, each of said electrically controllable means including memory means for storing an electrical signal which determines the extent of said modification; a single adjusting means for providing adjustment signals for adjusting the extent of input signal modification of a selected one of said plurality of signal processing devices; and enabling means coupled to each of said memory means and responsive to the manual selection of a one of said signal processing means to be adjusted for causing said electrical signal stored in the memory means of the electrically controllable means associated with the selected signal processing means to be adjusted in response to said adjustment signals provided by said adjusting means.

10. Apparatus as claimed in claim 9 wherein said enabling means includes means for manually selecting a signal processing device to be adjusted, and means responsive to the selection of a signal processing device for adjusting the stored electrical signal for the selected signal processing device in accordance with said adjustment signal from said adjusting means.

11. Apparatus as claimed in claim 10 wherein each memory means includes an addressable register for storing said electrical signal as a digital signal representing the extent to which said associated input signal is to be modified by the associated signal processing device, and wherein said signal adjusting means includes a memory for storing the addresses of said registers and the digital signals respectively stored therein, and control means for adjusting the digital signal of the selected signal processing device stored in said memory in accordance with said adjustment signal to produce an adjusted digital signal and for providing said adjusted digital signal to said addressable register for said selected signal processing device.

12. Apparatus as claimed in claim 11 wherein said control means includes a microprocessor programmed to
  interrogate said selecting means and said adjusting means to determine said selected signal processing device and said adjustment signal,
  obtain the stored register address and stored digital value of the selected signal processing device from said memory,
  determine an adjusted digital signal from said stored digital signal and said adjustment signal, and
  load said adjusted signal into said register for said selected signal processing device.

13. Apparatus for controlling volume and balance in a stereophonic receiver comprising:
  an electrically controllable means for each stereophonic channel of said receiver for setting the volume level in that channel in accordance with an electrical signal provided thereto, each including memory means for storing the associated said electrical signal,
  means for selecting either a level change in volume or in balance,
  adjusting means responsive to said selecting means for producing signals indicating a desired level change in volume or balance,
  control means responsive to said level change signals for determining adjusted electrical signals for producing adjusted volume settings for each channel, and
  means for transmitting said adjusted electrical signals to said memory means.

14. Apparatus as claimed in claim 13 further comprising a tone control circuit having a plurality of paths for different audio signal frequencies, electrically controllable means for each path for setting the signal level therein responsive to an associated electrical signal provided thereto, means for selecting a function defining the fashions in which the signal levels in each path are to change with volume, and means responsive to selection of said function and to a change in volume level for deriving an adjusted electrical signal for at least one path of said tone control circuit and for providing said adjusted electrical signal to said electrically controllable means for said signal path.

15. Control apparatus for an audio receiver having a plurality of audio signal processing devices each providing a variable modification in an associated characteristic of an associated audio signal comprising a plurality of electrically controllable means each associated with a corresponding one of said audio signal processing devices for setting the extent of modification of the associated audio signal, a plurality of addressable registers each coupled to a corresponding one of said electrically controllable means for storing and providing to the associated electrically controllable means a digital signal determining the extent of modification of the associated audio signal, a single adjusting means for providing adjustment signals indicating the magnitude and direction of a desired change in signal processing by a selected signal processing means, a memory for storing the addresses of said addressable registers and their respectively associated digital signals, means for selecting one of said audio signal processing devices for adjustment, display means, and control means for causing said display means to display an indication of the extent of signal modification being provided by the selected audio signal processing device, for determining an adjusted digital signal for the selected audio signal processing device in accordance with said adjustment signal and for providing said adjusted digital signal to said register for the selected audio signal processing device.

16. A tone control for an audio receiver comprising: a treble circuit including a low-phase filter for low-pass filtering an audio signal, means for subtracting the output of said low-pass filter from said audio signal to yield a treble signal, and means for controlling the amplitude of said treble signal; a bass circuit including a high-pass filter for high-pass filtering said audio signal, means for subtracting the output of said high pass filter from said audio signal to yield a bass signal, and means for controlling the amplitude of said bass signal; a midrange circuit including means for subtracting said treble signal and said bass signal from said audio signal to yield a midrange signal, and means for controlling the amplitude of said midrange signal; and means for summing the amplitude controlled treble, bass and midrange signals to provide a tone adjusted audio signal.

17. A method for tone control in an audio receiver receiving an incoming audio signal comprising the steps of filtering said audio signal to obtain a low frequency component and a high frequency component, substracting said low frequency component from said audio signal to yield a treble signal, subtracting said high frequency component from said audio signal to obtain a bass signal, subtracting said treble signal and said bass signal from said audio signal to obtain a midrange signal, controlling the amplitudes of said treble, bass, and midrange signals, and summing said amplitude controlled treble, bass and midrange signals to derive a tone controlled audio signal.

18. Apparatus for processing an audio signal, comprising a tone control circuit for modifying the frequency versus amplitude characteristics of said audio signal in accordance with control signals provided thereto, manual tone adjustment means for providing manually adjustable control signals for said tone control circuit to control the modification thereby of said frequency versus amplitude characteristics of said audio signal, means for selecting a loudness function defining the fashion in which the frequency versus amplitude characteristics of said audio signal is to change with volume of said audio signal, and correction control means responsive to the selection of said function, to said manually adjustable control signals, and to a change in volume level for deriving corrected control signals for provision to said tone control circuit for adjusting said frequency versus amplitude characteristic of said audio signal in accordance with said loudness function whereby a single tone control circuit is used for both tone adjustment and loudness function adjustment of said audio signal's frequency versus amplitude characteristics.

19. Apparatus as set forth in claim 18, wherein said tone control circuit includes memory means for storing said control signals and for controlling said frequency versus amplitude characteristics in accordance with said stored control signals, and wherein said means for deriving said corrected control signals includes means for causing said corrected control signals to be stored in said memory means.

* * * * *